US011406028B2

(12) United States Patent
Kim et al.

(10) Patent No.: US 11,406,028 B2
(45) Date of Patent: Aug. 2, 2022

(54) ELECTRONIC DEVICE INCLUDING PROTECTIVE HINGE STRUCTURE PREVENTING FOREIGN MATTER FROM ENTERING ELECTRONIC DEVICE

(71) Applicant: Samsung Electronics Co., Ltd., Gyeonggi-do (KR)

(72) Inventors: Jongyoon Kim, Gyeonggi-do (KR); Jungjin Kim, Gyeonggi-do (KR); Chungkeun Yoo, Gyeonggi-do (KR); Seunghyun Hwang, Gyeonggi-do (KR); Jungwon Park, Gyeonggi-do (KR); Chungil Choi, Gyeonggi-do (KR); Daehyeong Park, Gyeonggi-do (KR); Minwoo Yoo, Gyeonggi-do (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/865,634

(22) Filed: May 4, 2020

(65) Prior Publication Data

US 2020/0383215 A1  Dec. 3, 2020

(30) Foreign Application Priority Data

May 29, 2019  (KR) .................. 10-2019-0062850
Jun. 21, 2019  (KR) .................. 10-2019-0074428

(51) Int. Cl.
*H05K 5/00* (2006.01)
*H05K 5/02* (2006.01)

(52) U.S. Cl.
CPC ......... *H05K 5/0017* (2013.01); *H05K 5/0004* (2013.01); *H05K 5/0226* (2013.01)

(58) Field of Classification Search
CPC .. G06F 1/1681; H05K 5/0017; H05K 5/0226; H05K 5/0004
See application file for complete search history.

(56) References Cited

U.S. PATENT DOCUMENTS 8,277,001 B2 * 10/2012 Vincent ............... H05K 7/1488
                                                        312/294
8,707,516 B2 *  4/2014 Koyama ............. H04M 1/0216
                                                        16/250

(Continued)

FOREIGN PATENT DOCUMENTS

JP      5-127775       5/1993
JP      10-280780      10/1998

(Continued)

OTHER PUBLICATIONS

International Search Report dated Aug. 26, 2020 issued in counterpart application No. PCT/KR2020/005320, 8 pages.

*Primary Examiner* — Rockshana D Chowdhury
*Assistant Examiner* — Douglas R Burtner
(74) *Attorney, Agent, or Firm* — The Farrell Law Firm, P.C.

(57) ABSTRACT

Disclosed is an electronic device including a first housing, a second housing, a display disposed on the first housing and the second housing, at least one hinge structure that connects the first housing and the second housing, a hinge housing that surrounds at least part of the at least one hinge structure, and at least one foreign matter collection member that is disposed on one side of the at least one hinge structure and that collects foreign matter introduced into the electronic device.

8 Claims, 22 Drawing Sheets

(56) References Cited

U.S. PATENT DOCUMENTS

| | | | |
|---|---|---|---|
| 9,415,389 B2* | 8/2016 | Doyle | B01L 3/50 |
| 10,082,838 B1 | 9/2018 | Hong et al. | |
| 10,231,347 B2 | 3/2019 | Seo et al. | |
| 10,244,643 B1* | 3/2019 | Yun | G02F 1/133308 |
| 10,429,903 B2 | 10/2019 | Hong et al. | |
| 10,696,238 B2* | 6/2020 | Chang | B60R 11/0247 |
| 11,029,735 B2* | 6/2021 | Silvanto | E05D 11/0081 |
| 2006/0077622 A1* | 4/2006 | Keely | G06F 1/1616 |
| | | | 361/679.09 |
| 2008/0115328 A1 | 5/2008 | Tomaini et al. | |
| 2012/0118773 A1* | 5/2012 | Rayner | H05K 5/069 |
| | | | 206/320 |
| 2015/0184437 A1* | 7/2015 | Wikander | G06F 1/1681 |
| | | | 16/354 |
| 2016/0187935 A1* | 6/2016 | Tazbaz | G06F 1/1681 |
| | | | 361/679.55 |
| 2017/0099742 A1* | 4/2017 | Choi | H05K 5/069 |
| 2017/0142847 A1* | 5/2017 | Park | G06F 1/1681 |
| 2018/0049329 A1 | 2/2018 | Seo et al. | |
| 2019/0033925 A1 | 1/2019 | Hong et al. | |
| 2019/0041922 A1* | 2/2019 | Kurma Raju | G06F 1/1637 |
| 2020/0063476 A1* | 2/2020 | Lin | E05D 3/122 |
| 2021/0207413 A1* | 7/2021 | Hotomi | F16C 11/04 |

FOREIGN PATENT DOCUMENTS

| | | |
|---|---|---|
| JP | 2010/126878 | 6/2010 |
| KR | 1020180018007 | 2/2018 |

* cited by examiner

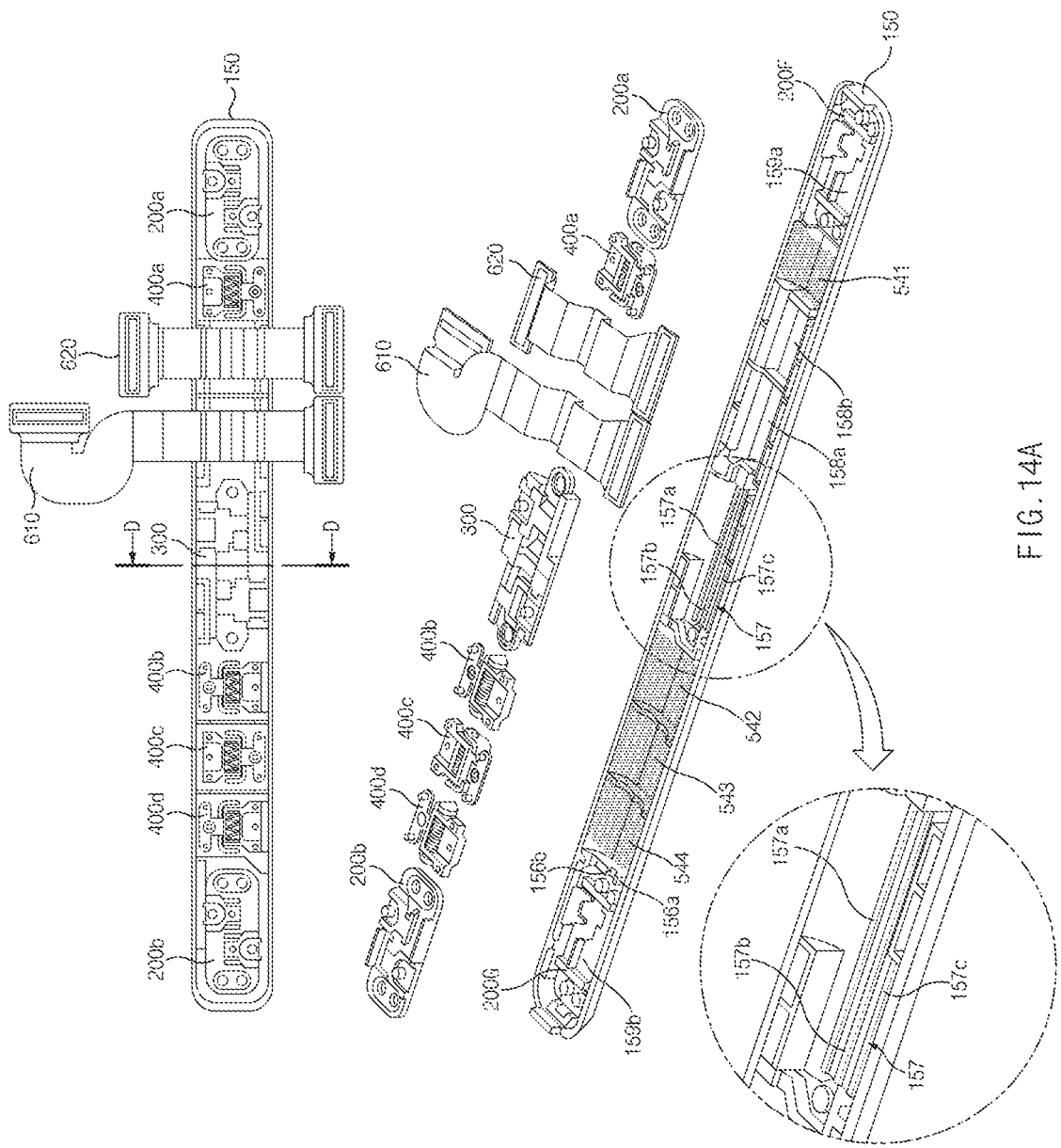

ELECTRONIC DEVICE INCLUDING PROTECTIVE HINGE STRUCTURE PREVENTING FOREIGN MATTER FROM ENTERING ELECTRONIC DEVICE

CROSS-REFERENCE TO RELATED APPLICATION(S)

This application is based on and claims priority under 35 U.S.C. § 119 to Korean Patent Application No. 10-2019-0074428, filed on Jun. 21, 2019 and Korean Patent Application No. 10-2019-0062850, filed on May 29, 2019, in the Korean Intellectual Property Office, the disclosure of which is incorporated herein by reference in its entirety.

BACKGROUND

1. Field

The disclosure relates generally to an electronic device, and more particularly, to an electronic device including a hinge structure.

2. Description of Related Art

Portable electronic devices such as smartphones may provide various functions, such as telephone call, video playback, and Internet search functions, based on various types of applications. Recently, various forms of foldable electronic devices have been developed to create a wider screen while maintaining portability.

Conventional foldable electronic devices include a plurality of housings by which a display is foldable in a predetermined direction, and employ a hinge structure connecting the housings. A space is formed between the housings and the hinge structure in a process of disposing the housings and the hinge structure, causing foreign matter to be introduced into the foldable electronic device through the space. The foreign matter tends to adversely influence operation of electronic parts in the foldable electronic device, or may affect hinge motion of the hinge structure. For example, when the conventional foldable electronic device performs a hinge motion when specific foreign matter is on a rear surface of the display, the foreign matter tends to cause a malfunction in the display. As such, there is a need in the art for a method and apparatus that eliminate the propensity for foreign matter to be introduced into the display of the foldable electronic device.

SUMMARY

Aspects of the disclosure are to address at least the above-mentioned problems and/or disadvantages and to provide at least the advantages described below. Accordingly, an aspect of the disclosure is to provide an electronic device including a hinge structure that employs a structure for preventing introduction of foreign matter into the electronic device Another aspect of the disclosure is to provide an electronic device including a hinge structure that is capable of suppressing movement of foreign matter to prevent the foreign matter from adhering to parts of or moving parts around the electronic device.

In accordance with an aspect of the disclosure, an electronic device includes a first housing, a second housing, a display disposed on the first housing and the second housing, at least one hinge structure configured to connect the first housing and the second housing, a hinge housing configured to accommodate at least part of the at least one hinge structure, and at least one foreign matter collection member disposed on one side of the at least one hinge structure and configured to collect foreign matter introduced into the electronic device.

In accordance with another aspect of the disclosure, an electronic device includes a first housing, a second housing, a display disposed on the first housing and the second housing, at least one hinge structure located in a position to connect edges at which the first housing and the second housing meet when the display is in a flat state, at least one detent structure connected to the first housing and the second housing, a hinge housing in which at least part of the at least one hinge structure and at least part of the at least one detent structure are mounted, and at least one foreign matter collection member disposed on at least part of the inside of the hinge housing on which the at least one detent structure is mounted, wherein a first axis about which the first housing rotates and a second axis about which the second housing rotates are formed at positions spaced apart upward from a bottom surface of the display by a predetermined distance.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 14A illustrates an arrangement of foreign matter collection members according to a second embodiment.

DETAILED DESCRIPTION

Figure 1A:
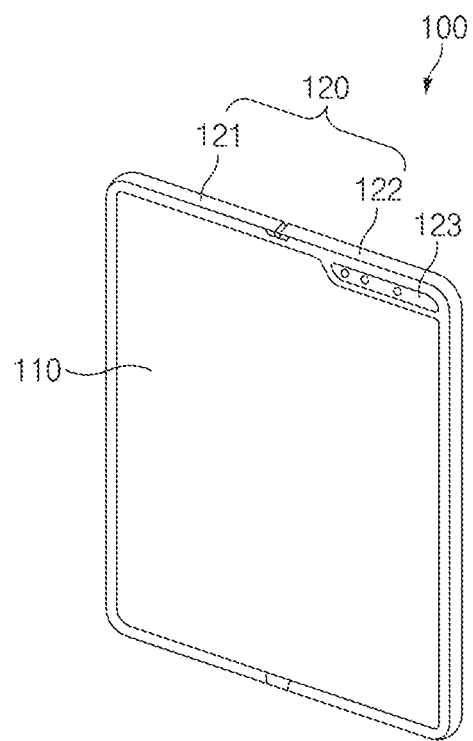
FIG. 1A illustrates the front exterior of a foldable electronic device in a first state according to an embodiment.

Embodiments of the disclosure will now be described with reference to accompanying drawings. Accordingly, those of ordinary skill in the art will recognize that modifications, equivalents, and/or alternatives on the embodiments described herein can be made without departing from the scope and spirit of the disclosure. With regard to description of drawings, similar components may be marked by similar reference numerals. Descriptions of well-known functions and/or configurations will be omitted for the sake of clarity and conciseness.

Expressions such as "have", "may have", "include" and "comprise", or "may include" and "may comprise" used herein indicate existence of corresponding components such as numeric values, functions, operations, or parts, but do not exclude presence of additional features.

The expressions "A or B", "at least one of A or/and B", or "one or more of A or/and B", and the like may include any and all combinations of one or more of the associated listed items. For example, the expressions "A or B", "at least one of A and B", and "at least one of A or B" may refer to at least one of (1) where at least one A is included, (2) where at least one B is included, and (3) where both of at least one A and at least one B are included.

Terms, such as "first" and "second" used in the disclosure may be used to refer to various components regardless of the order and/or priority and to distinguish the relevant components from other components, but do not limit the components. For example, "a first user device" and "a second user device" indicate different user devices regardless of the order or priority. A first component may be referred to as a second component, and similarly, a second component may be referred to as a first component.

It will be understood that when a first component is referred to as being operatively or communicatively coupled with/to or connected to another component, such as a second component, the first component may be directly coupled with/to or connected to the second component or an intervening third component may be present. In contrast, when the first component is referred to as being directly coupled with/to or directly connected to the second component, it should be understood that there is no intervening third component present.

The expression "configured to" used in the disclosure may be used as the expression "suitable for", "having the capacity to", "designed to", "adapted to", "made to", or "capable of", depending on the situation. The term "configured to" may indicate "specifically designed to" in hardware, and "a device configured to" may indicate that the device is capable of operating together with another device or other parts. For example, a "processor configured to (or set to) perform A, B, and C" may indicate an embedded processor for performing a corresponding operation or a generic-purpose processor (e.g., a central processing unit (CPU) or an application processor (AP)) which performs corresponding operations by executing one or more software programs stored in a memory device.

Terms used in the disclosure are used to describe embodiments and are not intended to limit the scope of the disclosure. Terms of a singular form may include plural forms unless otherwise specified. All the terms used herein, which include technical or scientific terms, may have the same meaning that is generally understood by a person skilled in the art. Terms which are defined in a dictionary and commonly used should also be interpreted as is customary in the relevant related art and not in an idealized or overly formal unless expressly so defined in embodiments of the disclosure. In some cases, even terms defined in the disclosure may not be interpreted to exclude embodiments of the disclosure.

An electronic device herein may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), motion picture experts group (MPEG-1 or MPEG-2) audio layer 3 (MP3) players, mobile medical devices, cameras, or wearable devices. The wearable device may include at least one of an accessory type (e.g., watches, rings, bracelets, anklets, necklaces, glasses, contact lens, or head-mounted-devices (HMDs)), a fabric or garment-integrated type (e.g., an electronic apparel), a body-attached type (e.g., a skin pad or tattoos), or a bio-implantable type (e.g., an implantable circuit) of wearable device.

Hereinafter, the term "user" may refer to a person who uses an electronic device or to an artificial intelligence electronic device that uses the electronic device.

Figure 1B:
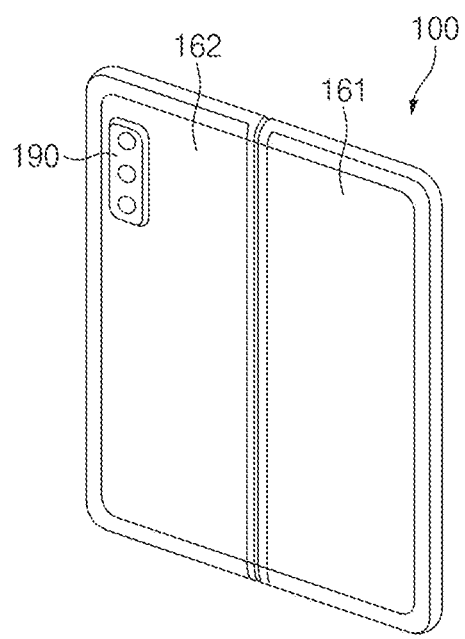
FIG. 1B illustrates the rear exterior of the foldable electronic device in the first state according to an embodiment.
Figure 1C:
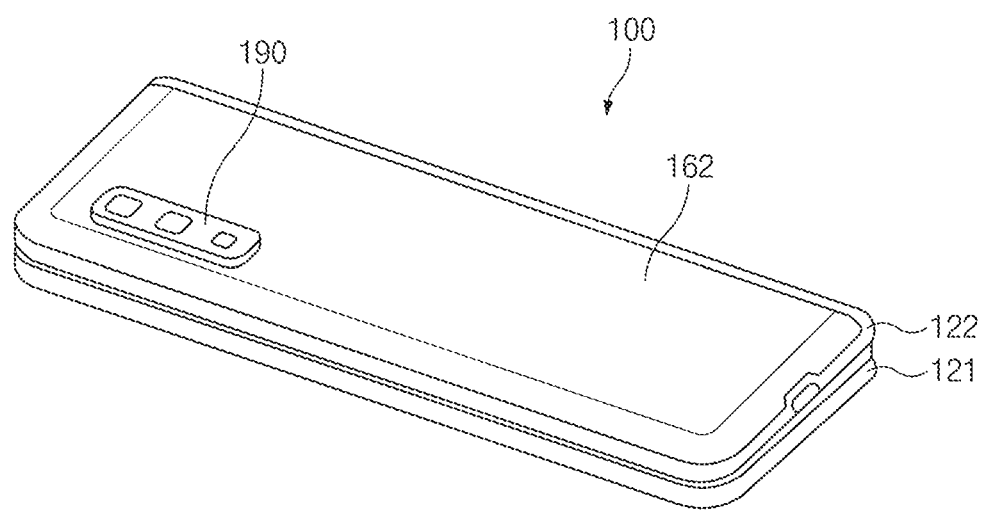
FIG. 1C illustrates the exterior of the foldable electronic device in a second state according to a first embodiment.
Figure 1D:
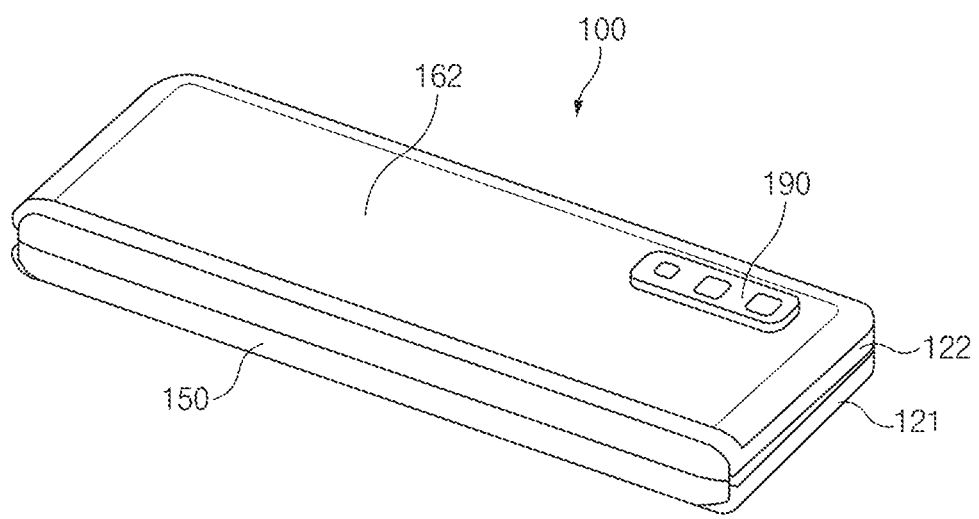
FIG. 1D illustrates the exterior of the foldable electronic device in the second state according to a second embodiment.

FIG. 1A illustrates the front exterior of a foldable electronic device in a first state according to an embodiment. FIG. 1B illustrates the rear exterior of the foldable electronic device in the first state according to an embodiment. FIG. 1C illustrates the exterior of the foldable electronic device in a second state according to a first embodiment. FIG. 1D illustrates the exterior of the foldable electronic device in the second state according to a second embodiment.

Referring to FIGS. 1A, 1B, 1C and 1D, the electronic device or the foldable electronic device 100 (hereinafter, referred to as the foldable electronic device) according to one embodiment may include a housing 120 including a first housing structure 121 and a second housing structure 122, a display 110 (e.g., a flexible display), a first cover 161, a second cover 162, a hinge housing 150 having a hinge structure disposed therein, and a sensor module 190. FIGS. 1A and 1B illustrate a front surface and a rear surface of the foldable electronic device 100 in the first state (e.g., a flat state or an unfolded state), and FIGS. 1C and 1D are perspective views including upper and lower surfaces (or left and right surfaces) of the foldable electronic device 100 in the second state (e.g., a folded state).

Depending on an arrangement, the first housing structure 121 may be disposed so as to be continuous with the second housing structure 122 (e.g., when a central portion of the display 110 is unfolded to be flat or when the housing 120 is in a flat state), or may be disposed side by side with the second housing structure 122. Alternatively, when the central portion of the display 110 is folded, one surface of the first housing structure 121 may face one surface of the second housing structure 122.

At least part of the first housing structure 121 may be formed of a metallic material or a non-metallic material. For example, the first housing structure 121 may be formed of a material having a predetermined stiffness to support at least part of the display 110. One area (or a first portion) of the display 110 may be disposed on a portion of a front surface of the first housing structure 121. At least a portion of the first housing structure 121 may have an empty space to mount electronic elements (e.g., printed circuit board or battery) or may be coupled with the first cover 161 to form an empty space. Electronic components, such as a printed circuit board (PCB), and components, such as at least one processor, at least one memory, and a battery, which are mounted on the PCB that are required to drive the display 110, may be disposed in the empty space. The periphery of the first housing structure 121 may be provided in a form that surrounds a periphery on one side of the display 110.

Depending on an arrangement, the second housing structure 122 may be disposed side by side with the first housing structure 121, or may be disposed such that at least one surface of the second housing structure 122 faces one surface of the first housing structure 121 on which the display 110 is disposed. The second housing structure 122 may be formed of the same material as that of the first housing structure 121. The second housing structure 122 may be disposed to be horizontally or vertically symmetric to the first housing structure 121, and at least part of the remaining area of the display 110 other than the area disposed on the first housing structure 121 may be disposed and supported on a front surface of the second housing structure 122. Similar to the first housing structure 121, the second housing structure 122 may include an empty space or may be coupled with the second cover 162 to form an empty space, and electronic components required to drive the display 110 may be disposed in the empty space. The periphery of the second housing structure 122 may be provided in a form that surrounds a periphery on an opposite side of the display 110.

The foldable electronic device 100 may include, on one side of the second housing structure 122, a sensor arrangement area 123 in which at least one sensor associated with operating a specific function of the foldable electronic device 100 is disposed, such as a proximity sensor, an illuminance sensor, an iris sensor, an image sensor (or a camera), and/or a fingerprint sensor. The sensor arrangement area 123 may be located on the rear surface of the foldable electronic device 100 when the at least one sensor is disposed on the rear surface of the foldable electronic device 100.

Depending on a folded or flat state of the foldable electronic device 100, the hinge housing 150 may be hidden by one side of the first housing structure 121 and one side of the second housing structure 122 (e.g., a flat or unfolded (open) state of the housing 120), or may be exposed to the outside (e.g., a folded (closed) state of the housing 120). For example, as illustrated in FIGS. 1A and 1B, the hinge housing 150 may be hidden by the first housing structure 121 and the second housing structure 122 when the first housing structure 121 and the second housing structure 122 are disposed side by side. As illustrated in FIGS. 1C and 1D, the hinge housing 150 may be exposed to the outside from between lateral portions of the first housing structure 121 and the second housing structure 122 when the one surface of the first housing structure 121 and the one surface of the second housing structure 122 face each other.

At least part of the display 110 may be foldable. The display 110 may include a first area disposed on the first housing structure 121, a second area disposed on the second housing structure 122, and a central area within a predetermined range with respect to the area to which the first housing structure 121 and the second housing structure 122 are adjacent. At least part of the central area may be flexible.

The sensor module 190 may be disposed on a predetermined area of the rear surface of the foldable electronic device 100. The sensor module 190 may include at least one of an image sensor, an illuminance sensor, a heart rate sensor, and a fingerprint sensor. It is illustrated that a plurality of image sensors are disposed. However, the disclosure is not limited thereto. The sensor module 190 may include a light emitting device (e.g., a lamp or a light-emitting diode (LED)) that may provide a flash function.

Figure 2:
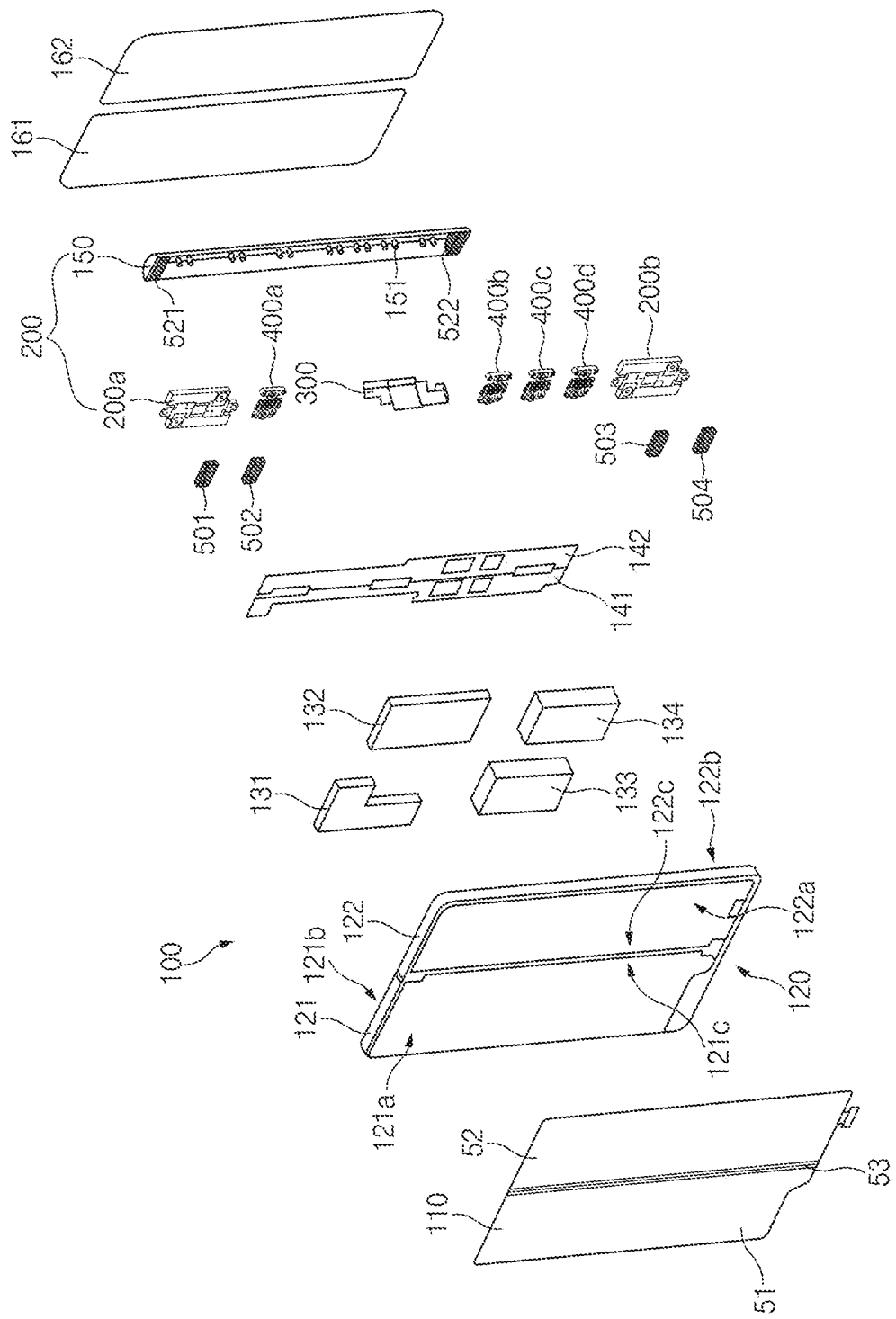
FIG. 2 illustrates an exploded perspective view of the foldable electronic device according to an embodiment.

FIG. 2 illustrates an exploded perspective view of the foldable electronic device according to an embodiment.

Referring to FIG. 2, the foldable electronic device 100 may include the display 110, the housing 120, and components including a first PCB 131, a second PCB 132, a first battery 133, a second battery 134, hinge plates 141 and 142, a hinge module 200, the first cover 161, the second cover 162, and foreign matter (e.g., particles, dust, or a foreign substance) collection members 501, 502, 503, 504, 521, and 522.

The display 110 may include a first area 51, a second area 52, and a central area 53. The central area 53 may include a predetermined area located on a central portion of the inside of the display 110 while the display 110 is folded. At least part of the first area 51 may be fixedly attached to the first housing structure 121. At least part of the second area 52 may be fixedly attached to the second housing structure 122. In this regard, an adhesive member may be disposed between the first area 51 of the display 110 and the first housing structure 121 and between the second area 52 of the display 110 and the second housing structure 122. The central area 53 may be disposed so as not to be fixed (or attached) to the first housing structure 121 and the second housing structure 122. Accordingly, while the display 110 is folded or unfolded, the central area 53 may be moved because the central area 53 is not attached to the first housing structure 121 and the second housing structure 122. In a folded state, a predetermined gap may be formed between at least part of the central area 53 and the hinge module 200.

The first housing structure 121 may include a first surface 121a and a second surface 121b opposite to the first surface 121a, and the second housing structure 122 may include a third surface 122a and a fourth surface 122b opposite to the third surface 122a. The first housing structure 121 and the second housing structure 122 may be folded or unfolded about the hinge module 200 within a specified angle range. When the display 110 is folded (or, when the first housing structure 121 and the second housing structure 122 are vertically disposed side by side or relatively wide surfaces are stacked), the third surface 122a may face the first surface 121a, and when the display 110 is flat, the first surface 121a and the third surface 122a may face the same direction.

A first peripheral portion 121c of the first housing structure 121 may be connected with a second peripheral portion 122c of the second housing structure 122 through the hinge module 200. The display 110 (or the flexible display layer) may be disposed across at least part of the first surface 121a and at least part of the third surface 122a. The display 110 may be folded at or in areas adjacent to the first peripheral portion 121c and the second peripheral portion 122c. The sensor arrangement area 123 may be disposed on one side of the second housing structure 122.

The first PCB 131 may be disposed between the second surface 121b of the first housing structure 121 and the first cover 161. The second PCB 132 may be disposed between the fourth surface 122b of the second housing structure 122 and the second cover 162. Alternatively, the first PCB 131 and the second PCB 132 may be integrated into one PCB and may be disposed between the second surface 121b of the first housing structure 121 and the first cover 161 or between the fourth surface 122b of the second housing structure 122 and the second cover 162. Various electronic components required to drive the foldable electronic device 100 may be disposed on the first PCB 131 and the second PCB 132. For example, components, such as a memory, at least one processor, communication circuitry, an antenna, a microphone, a speaker, at least one sensor and an electronic component associated with driving the sensor, and a camera, may be mounted on at least one of the first PCB 131 and the second PCB 132.

The first battery 133 may be disposed between the second surface 121b of the first housing structure 121 and the first cover 161. The second battery 134 may be disposed between the fourth surface 122b of the second housing structure 122 and the second cover 162. The first battery 133 and the second battery 134 may supply power required to drive the foldable electronic device 100. The first battery 133 and the second battery 134 may supply power to components, such as at least one of the first PCB 131 and the second PCB 132, the display 110, and at least one sensor, through wiring. Although it has been described that the foldable electronic device 100 includes the plurality of batteries, the disclosure is not limited thereto. For example, the foldable electronic device 100 may include only one battery.

The hinge plates 141 and 142 may include the first hinge plate 141 coupled with the first housing structure 121 and one side of the hinge module 200 and the second hinge plate 142 coupled with the second housing structure 122 and an opposite side of the hinge module 200. For example, one side of the first hinge plate 141 may be fixed to the periphery of the first housing structure 121 that is adjacent to the second housing structure 122, and an opposite side of the first hinge plate 141 may be fixed to portions of hinge structures 200a, 300, and 200b and at least one detent structures 400a, 400b, 400c, or 400d that are included in the hinge module 200.

The detent structures 400a, 400b, 400c, and 400d, which are mechanical apparatuses, may temporarily stop rotary motion of the foldable electronic device 100 or may stop rotary motion of the device at a specified pressure or less and allow rotary motion of the device at more than the specified pressure. The detent structures 400a, 400b, 400c, and 400d may enable a mounting function at a specified angle depending on hinge motions of the first housing structure 121 and the second housing structure 122. For example, when the internal angle between the first housing structure 121 and the second housing structure 122 reaches a predetermined angle, the detent structures 400a, 400b, 400c, and 400d may stop rotation of the first housing structure 121 and the second housing structure 122, and when a specified force or more is applied, the detent structures 400a, 400b, 400c, and 400d may allow the first housing structure 121 and the second housing structure 122 to be unfolded with the specified angle in a folded or folded with the specified angle in a flat state. Accordingly, while a user folds or unfolds the first housing structure 121 or the second housing structure 122, the force applied to fold or unfold the housing structures 121 and 122 may be transmitted to at least parts of the hinge structures 200a, 200b, and 300 and at least parts of the detent structures 400a, 400b, 400c, and 400d.

One side of the second hinge plate 142 may be fixed to the periphery of the second housing structure 122 that is adjacent to the first housing structure 121, and an opposite side of the second hinge plate 142 may be fixed to the remaining portions of the hinge structures 200a, 300, and 200b and the detent structures 400a, 400b, 400c, and 400d that are included in the hinge module 200. Accordingly, the force (or pressure) applied to fold or unfold the first housing structure 121 or the second housing structure 122 may be transmitted to at least the remaining parts of the hinge structures 200a, 200b, and 300 and the detent structures 400a, 400b, 400c, and 400d.

The hinge module 200 may include the hinge housing 150, the first hinge structure 200a, the second hinge structure 200b, the third hinge structure 300, the detent structures 400a, 400b, 400c, and 400d, and the foreign matter collection members 501, 502, 503, 504, 521, and 522. At least some of the foreign matter collection members 501, 502, 503, 504, 521, and 522 may include an adhesive material capable of collecting foreign matter introduced or flowing into the foldable electronic device 100. Alternatively, at least some of the foreign matter collection members 501, 502, 503, 504, 521, and 522 may include an electrified material or an elastic material that is capable of adsorbing introduced foreign matter (e.g., dust, small sand, or the like).

The hinge housing 150 may have a semi-cylindrical shape (or the shape of a container with a semi-elliptical cross-section) that is closed at opposite ends. The hinge housing 150 may include an empty space in which the first hinge structure 200a, the second hinge structure 200b, the third hinge structure 300, and the detent structures 400a, 400b, 400c, and 400d are mounted. The hinge housing 150 may have a length that corresponds to the length of the display 110 in the direction of one axis (e.g., a longitudinal axis) or the length of the first housing structure 121 in the direction of one axis (e.g., a longitudinal axis). The hinge housing 150 may have a semi-circular, semi-elliptical, or partially-curved cross-section. The hinge housing 150 may include at least one boss 151 (e.g., a protrusion for screw coupling) that is used to mount and fix at least one of the hinge structures 200a, 200b, and 300 and the detent structures 400a, 400b, 400c, and 400d. The foreign matter collection members 521 and 522 may be disposed on at least parts of the inside of the hinge housing 150. The foreign matter collection members 521 and 522 may collect foreign matter introduced into the foldable electronic device 100 and may suppress a movement of the foreign matter. The foreign matter collection members 521 and 522 may be provided in the form of a tape, liquid, or a gel and may be applied to predetermined areas of the inside of the hinge housing 150.

The first hinge structure 200a may be disposed at one point of the hinge housing 150 that is symmetric to the second hinge structure 200b with respect to a central portion of the hinge housing 150. For example, the first hinge structure 200a may be disposed to be biased to an upper side with respect to the central portion of the illustrated hinge housing 150. The first hinge structure 200a may be disposed adjacent to an upper end of the hinge housing 150. A portion of the first hinge structure 200a may be fixed to the hinge housing 150, and other portions of the first hinge structure 200a may be coupled to the hinge plates 141 and 142. For example, one side of the first hinge structure 200a may be coupled with one side of the first hinge plate 141, and an opposite side of the first hinge structure 200a may be coupled to one side of the second hinge plate 142. The first hinge structure 200a may perform hinge motion to correspond to rotary motions of the hinge plates 141 and 142 coupled thereto. Two sub-hinge structures of the first hinge structure 200a may be alternately disposed and may independently perform hinge motions depending on hinge motions of the hinge plates 141 and 142. At least part of the first hinge structure 200a may be formed of a metallic material.

The foreign matter collection members 501 and 502 may be disposed on one side of the first hinge structure 200a. For example, in FIG. 2, the foreign matter collection member 501 may be disposed on a left edge or side of the first hinge structure 200a, and the foreign matter collection member 502 may be disposed on a right edge or side of the first hinge structure 200a. The foreign matter collection members 501 and 502 may preferentially collect foreign matter introduced through a gap between one side (e.g., the left) of the hinge housing 150 and the first and second housing structures 121 and 122 and may suppress a movement of the introduced foreign matter. Accordingly, the foldable electronic device 100 may prevent occurrence of a phenomenon in which the introduced foreign matter (e.g., sand or particles having a predetermined size and hardness) is brought into contact with the display 110 to damage at least part of the display 110.

The second hinge structure 200b may be disposed at an opposite point of the hinge housing 150 that is symmetric to the first hinge structure 200a with respect to the central portion of the hinge housing 150. Alternatively, the second hinge structure 200b may be disposed to be biased to a lower side with respect to the central portion of the illustrated hinge housing 150. The second hinge structure 200b may be disposed adjacent to a lower end of the hinge housing 150. A portion of the second hinge structure 200b may be fixed to the hinge housing 150, and other portions of the second hinge structure 200b may be coupled to the hinge plates 141 and 142. For example, one side of the second hinge structure 200b may be coupled with an opposite side of the first hinge plate 141, and an opposite side of the second hinge structure 200b may be coupled to an opposite side of the second hinge plate 142. The second hinge structure 200b may perform hinge motion to correspond to rotary motions of the hinge plates 141 and 142 coupled thereto.

Similar to the first hinge structure 200a, the second hinge structure 200b may include two sub-hinge structures that are alternately disposed and that independently perform hinge motions depending on hinge motions of the hinge plates 141 and 142. The second hinge structure 200b may be formed of the same material as that of the first hinge structure 200a. The second hinge structure 200b may have substantially the same structure and shape as the first hinge structure 200a, but may differ from the first hinge structure 200a in terms of the position on the hinge housing 150.

The foreign matter collection members 503 and 504 may be disposed on one side of the second hinge structure 200b. For example, the foreign matter collection member 503 may be disposed on a left edge of the second hinge structure 200a, and the foreign matter collection member 504 may be disposed on a right edge of the second hinge structure 200b. The foreign matter collection members 503 and 504 may preferentially collect foreign matter introduced through a gap between an opposite side (e.g., the right) of the hinge housing 150 and the first and second housing structures 121 and 122 and may suppress a movement of the introduced foreign matter. Accordingly, the foldable electronic device 100 may prevent occurrence of a phenomenon in which the introduced foreign matter (e.g., sand or particles having a predetermined size and hardness) is brought into contact with the display 110 to potentially damage at least part of the display 110.

The third hinge structure 300 may be disposed on the central portion of the hinge housing 150. A portion of the third hinge structure 300 may be fixed to the hinge housing 150, and other portions of the third hinge structure 300 may be connected to the first hinge plate 141 and the second hinge plate 142. The third hinge structure 300 may transmit force through interlocking gears such that the first hinge plate 141 and the first housing structure 121 coupled to the first hinge plate 141 (or the second hinge plate 142 and the second housing structure 122 coupled to the second hinge plate 142) perform hinge motion together with the second hinge plate 142 and the second housing structure 122 coupled to the second hinge plate 142 (or the first hinge plate 141 and the first housing structure 121 coupled to the first hinge plate 141).

The detent structures 400a, 400b, 400c, and 400d may be disposed at predetermined positions in the hinge housing 150. For example, the first detent structure 400a may be disposed between the first hinge structure 200a and the third hinge structure 300. The second to fourth detent structures 400b, 400c, and 400d may be disposed between the second hinge structure 200b and the third hinge structure 300. In FIG. 2, the hinge module 200 includes the four detent structures 400a, 400b, 400c, and 400d. However, the disclosure is not limited thereto. For example, the hinge module 200 may include one, two or more detent structures. The detent structures 400a, 400b, 400c, and 400d may have the same structure and size, but may be disposed in the hinge housing 150 in different directions.

The first cover 161 may be disposed on a rear surface of the first housing structure 121 to cover at least part of the second surface 121b of the first housing structure 121. The first cover 161 may be disposed to cover one side of the hinge housing 150 that is disposed between the first housing structure 121 and the second housing structure 122. The first cover 161 may have rounded corners. The first cover 161 may have an empty space inside or may be fastened with the second surface 121b of the first housing structure 121 to form an empty space between the first housing structure 121 and the first cover 161. For example, the first cover 161 may have a structure in which sidewalls are formed on an upper side, a left side, and a right side of a rectangular bottom surface.

The second cover 162 may be disposed adjacent to the first cover 161 and may be fastened to the fourth surface 122b of the second housing structure 122 to cover at least part of the fourth surface 122b. The second cover 162 may be disposed to cover the remaining portion of the hinge module 200 (e.g., an opposite side of the hinge housing 150) that is partly hidden by the first cover 161. The second cover 162 may have rounded corners, similar to the first cover 161. The second cover 162 may have an empty space inside or may be fastened with the fourth surface 122b of the second housing structure 122 to form an empty space between the second housing structure 122 and the second cover 162. In this regard, the second cover 162 may have a structure in which sidewalls are formed on a lower side, a left side, and a right side of a rectangular bottom surface.

Although it has been described that the first hinge structure 200a and the second hinge structure 200b are disposed at the opposite ends of the hinge housing 150 with respect to the central portion of the hinge housing 150 and the third hinge structure 300 is disposed between the first hinge structure 200a and the second hinge structure 200b, the disclosure is not limited thereto. For example, separate interlocking gears may not be included, and only one of the first hinge structure 200a and the second hinge structure 200b that are not interlocked with each other may be disposed in the hinge housing 150. For example, the first hinge structure 200a having a non-interlocking structure may be disposed at one end of the hinge housing 150, and a plurality of hinge structures in the type of the third hinge structure 300 (e.g., an interlocking structure including interlocking gears) may be disposed on the central portion of the hinge housing 150 or at an opposite end of the hinge housing 150.

Figure 3:
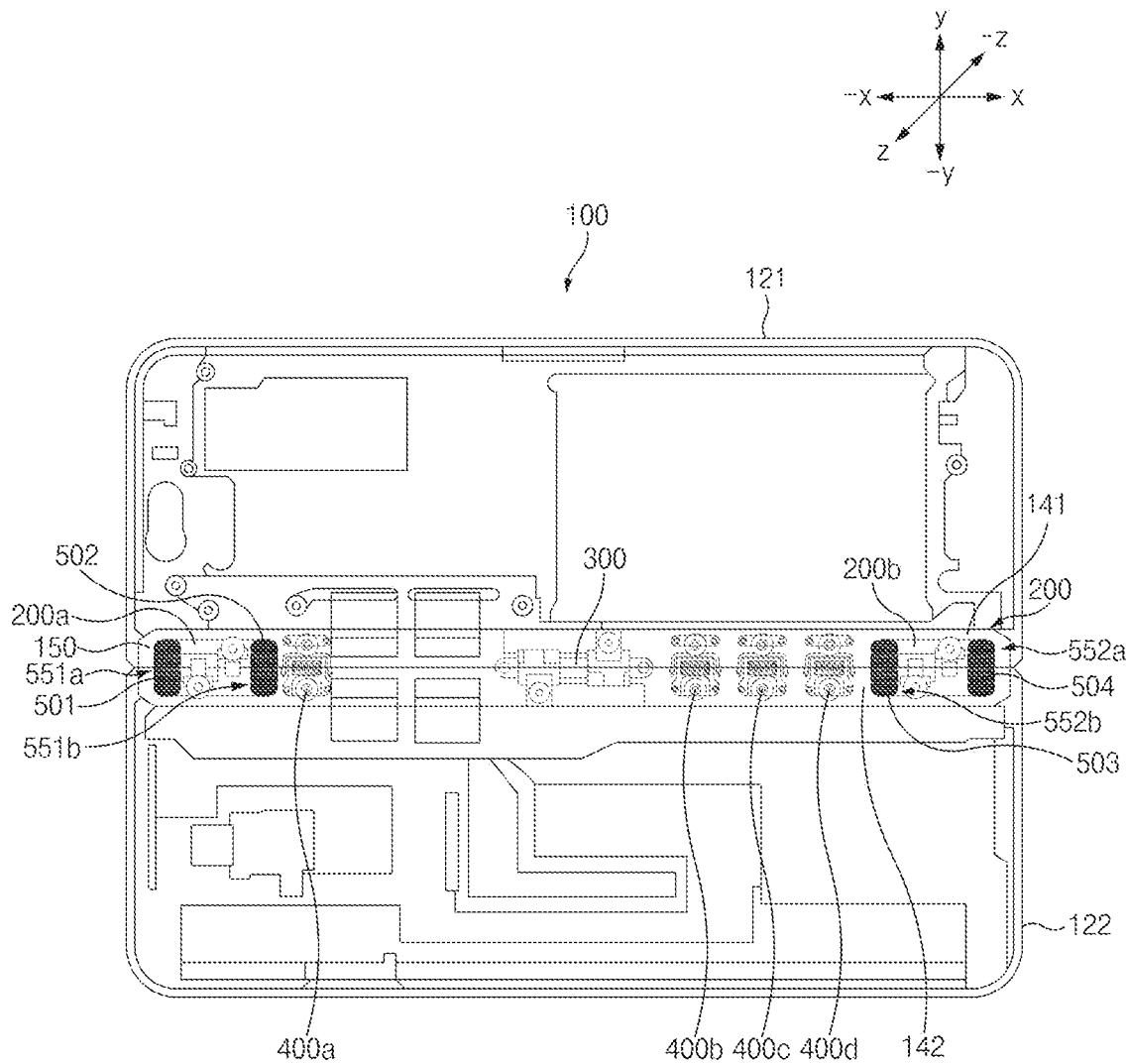
FIG. 3 illustrates a state in which some components of the foldable electronic device illustrated in FIG. 2 are coupled, according to an embodiment.

FIG. 3 illustrates a state in which some components of the foldable electronic device illustrated in FIG. 2 are coupled, according to an embodiment.

Referring to FIG. 3, the components of the foldable electronic device 100 may include the first housing structure 121, the second housing structure 122, and the hinge module 200. In the foldable electronic device 100 illustrated in FIG. 3, the display 110 is removed from the foldable electronic device 100 described with reference to FIG. 2.

The first housing structure 121 may be coupled with the first hinge plate 141. The first housing structure 121 may be disposed on one side of the hinge module 200, such as an upper side with respect to FIG. 2. The first PCB 131 or the first battery 133 described above with reference to FIG. 2 may be mounted in the first housing structure 121, and the first area 51 and a portion of the central area 53 of the display 110 may be disposed on the first housing structure 121.

The second housing structure 122 may be coupled with the second hinge plate 142. The second housing structure 122 may be disposed on an opposite side of the hinge module 200, such as a lower side with respect to FIG. 2. The second PCB 132 or the second battery 134 described above with reference to FIG. 2 may be mounted in the second housing structure 122, and the second area 52 and the remaining portion of the central area 53 of the display 110 may be disposed on the second housing structure 122.

The hinge module 200 may include the hinge housing 150, the first hinge structure 200a, the second hinge structure 200b, the third hinge structure 300, and at least one of the detent structures 400a, 400b, 400c, and 400d (e.g., the detent structure 400c of FIG. 3A). For example, the hinge module 200 may have a specified length in the horizontal direction and may have a semi-elliptical cross-sectional shape.

In FIG. 2, the first hinge structure 200a may be disposed at a left edge of the hinge housing 150, and the second hinge structure 200b may be disposed at a right edge of the hinge housing 150. The third hinge structure 300 may be disposed between the first hinge structure 200a and the second hinge structure 200b or in the center of the hinge housing 150.

Signal wiring, such as a flexible PCB (FPCB) may be disposed between the first detent structure 400a and the third hinge structure 300 to electrically connect electronic components placed in the first housing structure 121 and electronic components placed in the second housing structure 122. For example, a location where the signal wiring is placed may be assigned on one side of the hinge module 200.

The first detent structure 400a may be disposed between the first hinge structure 200a and the third hinge structure 300. The second detent structure 400b, the third detent structure 400c, and the fourth detent structure 400d may be disposed between the third hinge structure 300 and the second hinge structure 200b. The first detent structure 400a may be disposed adjacent to the first hinge structure 200a. The second detent structure 400b may be disposed adjacent to the third hinge structure 300. The fourth detent structure 400d may be disposed adjacent to the second hinge structure 200b. The third detent structure 400c may be disposed between the second detent structure 400b and the fourth detent structure 400d. The detent structures 400a, 400b, 400c, and 400d may be formed in substantially the same structure, but may also be disposed such that arrangement directions alternate with one another.

The foreign matter collection member 501 may be disposed on a left edge of the first hinge structure 200a with respect to FIG. 3. For example, the foreign matter collection member 501 may be disposed on a boss hole area 551a provided on the left edge of the first hinge structure 200a to couple the first hinge structure 200a to the hinge housing 150. The foreign matter collection member 502 may be disposed on a right edge of the first hinge structure 200a. For example, the foreign matter collection member 502 may be disposed on a boss hole area 551b provided on the right edge of the first hinge structure 200a to couple the first hinge structure 200a to the hinge housing 150. Similar to the foreign matter collection members 501 and 502 disposed on the first hinge structure 200a, the foreign matter collection members 503 and 504 may be disposed on the second hinge structure 200b on a boss hole area 552a formed on a left edge of the second hinge structure 200b, and the foreign matter collection member 504 may be disposed on a boss hole area 552b formed on a right edge of the second hinge structure 200b.

In the foldable electronic device 100, when foreign matter is introduced through the areas where the hinge housing 150 and the first housing structure 121 or the second housing structure 122 are disposed, the introduced foreign matter may be collected by the foreign matter collection members 501, 502, 503, and 504. Accordingly, the foldable electronic device 100 may suppress diffusion of the foreign matter inside and may prevent damage or device failure by the foreign matter.

Figure 4:
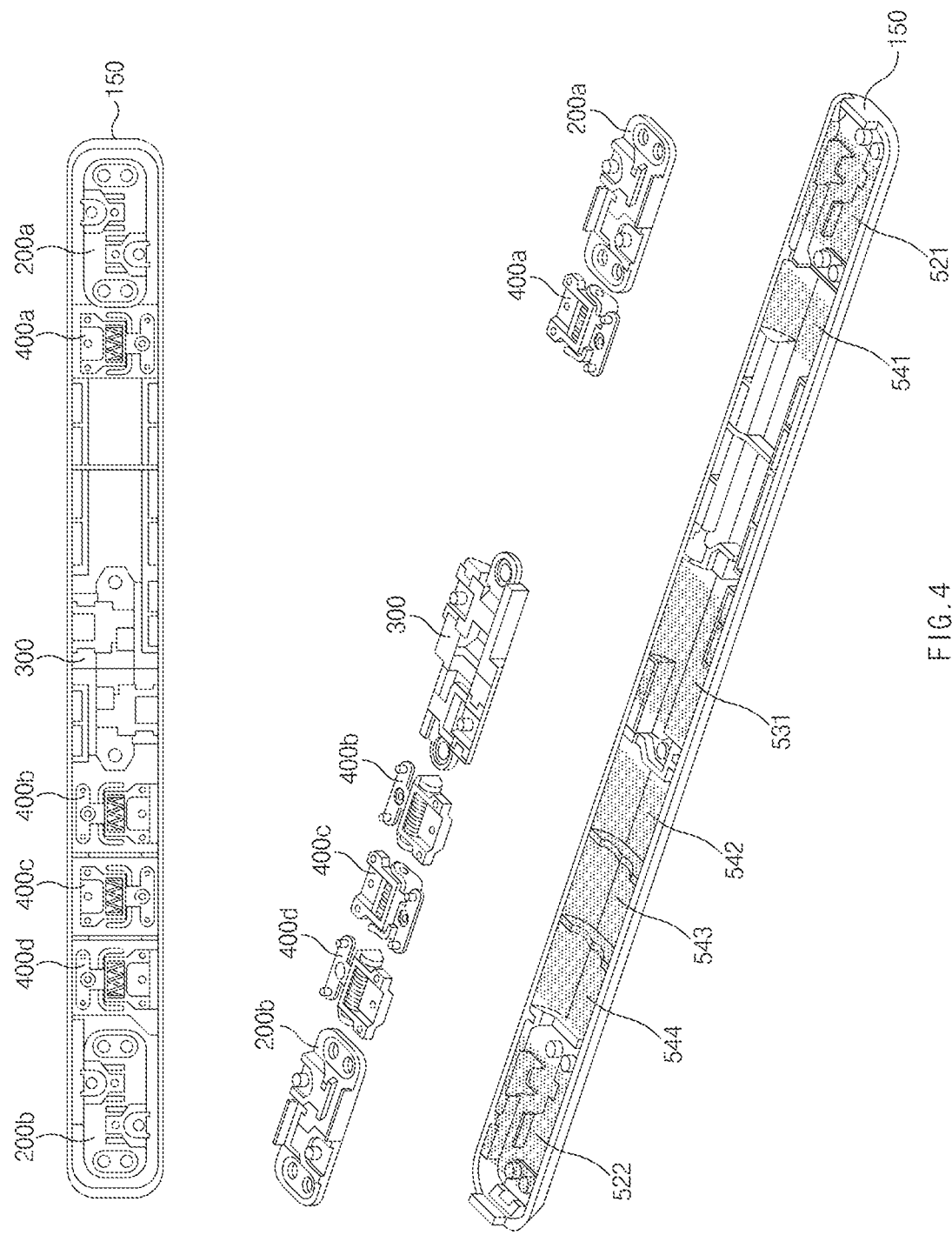
FIG. 4 illustrates examples of a hinge module and a hinge housing according to an embodiment.

FIG. 4 illustrates examples of the hinge module and the hinge housing according to an embodiment.

Referring to FIG. 4, as described above with reference to FIG. 2, the hinge housing 150 may have a hollow semi-cylindrical shape that is closed at opposite ends. The hinge structures 200a, 200b, and 300 and the detent structures 400a, 400b, 400c, and 400d may be disposed in the hinge housing 150. Foreign matter collection members 521, 522, 531, 541, 542, 543, and 544 may be disposed on at least parts of the inside of the hinge housing 150. For example, the first foreign matter collection member 521 may be disposed on the inside of the hinge housing 150 on which the first hinge structure 200a is mounted, and the second foreign matter collection member 522 may be disposed on the inside of the hinge housing 150 on which the second hinge structure 200b is mounted. The areas where the first foreign matter collection member 521 and the second foreign matter collection member 522 are disposed may be the remaining inside areas other than the inside areas of the hinge housing 150 that correspond to hinge brackets rotated in the first hinge structure 200a and the second hinge structure 200b. When the first hinge structure 200a and the second hinge structure 200b are disposed to be spaced apart from the inside of the hinge housing 150 at a predetermined interval, the first foreign matter collection member 521 and the second foreign matter collection member 522 may be disposed on (or applied to) the inside of the hinge housing 150 so as not to make contact with the first hinge structure 200a and the second hinge structure 200b.

The third foreign matter collection member 531 may be disposed on the inside of the hinge housing 150 on which the third hinge structure 300 including at least one gear is mounted. The third foreign matter collection member 531 may be provided in a form corresponding to the overall size of the third hinge structure 300. The third foreign matter collection member 531 may be disposed on the inside of the hinge housing 150 so as not to make contact with components (e.g., inner brackets) of the third hinge structure 300 that perform hinge motions.

The fourth to seventh foreign matter collection members 541, 542, 543, and 544 may be disposed on the areas of the hinge housing 150 where the detent structures 400a, 400b, 400c, and 400d are disposed. For example, the fourth foreign matter collection member 541 may be disposed on the inside of the hinge housing 150 on which the first detent structure 400a is disposed. Similarly, the fifth to seventh foreign matter collection members 542, 543, and 544 may be disposed on the inside of the housing 150 on which the second to fourth detent structures 400a, 400b, and 400d are disposed.

Although it has been described that the foreign matter collection members 521, 522, 531, 541, 542, 543, and 544 are disposed on the predetermined areas of the hinge housing 150, the disclosure is not limited thereto. For example, the foreign matter collection members 521, 522, 531, 541, 542, 543, and 544 may be applied to (or disposed on) the entire inside of the hinge housing 150. The sizes of the foreign matter collection members 521, 522, 531, 541, 542, 543, and 544 may vary depending on positions on the inside of the hinge housing 150. For example, among the foreign matter collection members 521, 522, 531, 541, 542, 543, and 544, the foreign matter collection members disposed close to the opposite edges of the hinge housing 150 may be formed to be larger than the foreign matter collection members disposed on the central portion of the hinge housing 150. Alternatively, the foreign matter collection members 521, 522, 531, 541, 542, 543, and 544 may be disposed in a structure including a plurality of pieces depending on the areas where the foreign matter collection members 521, 522, 531, 541, 542, 543, and 544 are disposed. In this case, the number or size of pieces of the foreign matter collection members disposed close to the opposite edges of the hinge housing 150 may be larger than the number or size of pieces of the foreign matter collection members located on the central portion of the hinge housing 150. As described above, foreign matter collection members may be disposed on only the opposite edges of the hinge housing 150.

Figure 5:
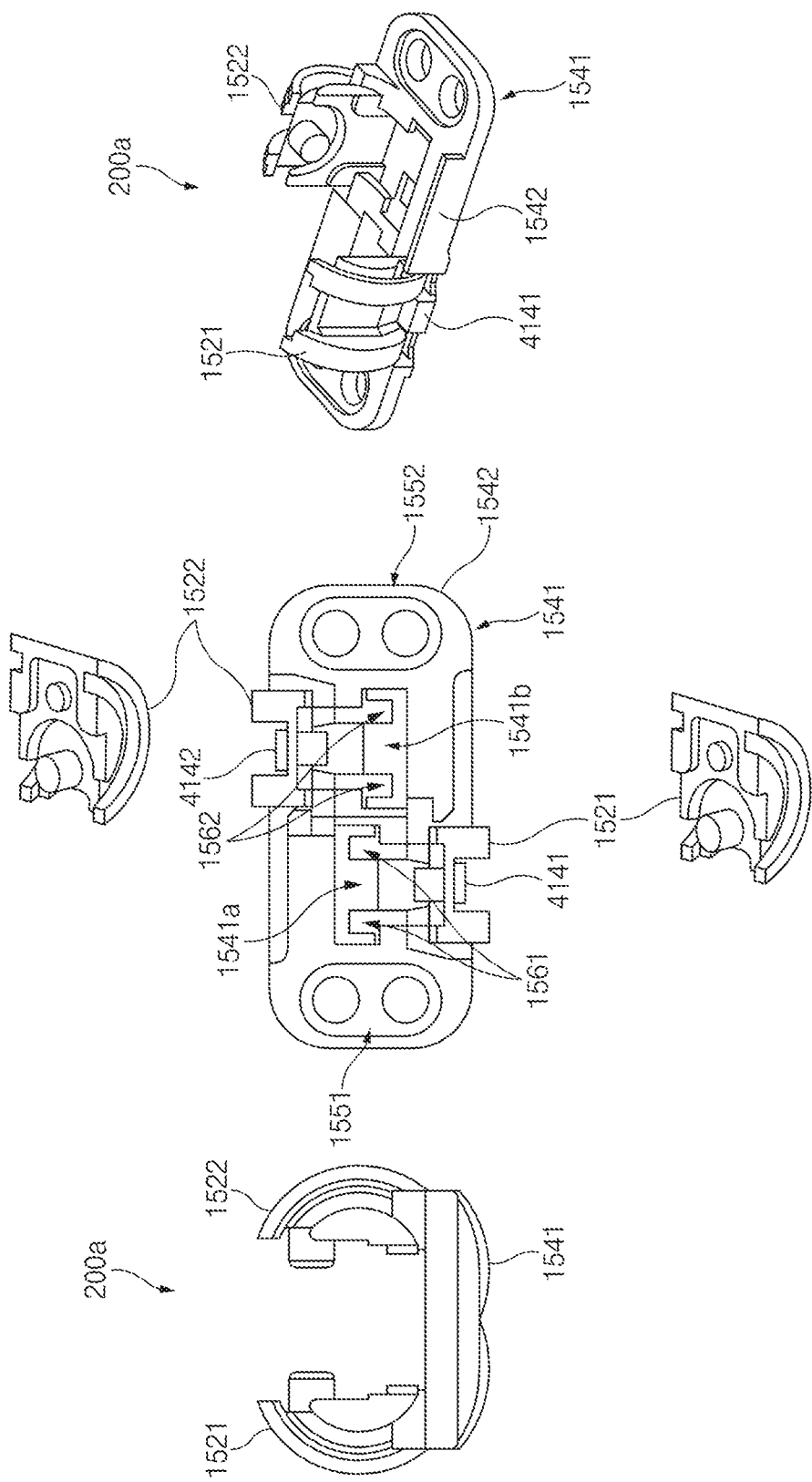
FIG. 5 illustrates a first hinge structure or a second hinge structure according to an embodiment.

FIG. 5 illustrates the first hinge structure or the second hinge structure according to an embodiment.

Referring to FIG. 5, the first hinge structure 200a (or the second hinge structure 200b, although the following description is given based on the first hinge structure 200a) may include a first hinge bracket 1521 connected to the first hinge plate 141, a second hinge bracket 1522 connected to the second hinge plate 142, and a center bracket 1541 on which the first hinge bracket 1521 and the second hinge bracket 1522 are mounted. The first hinge structure 200a according to one embodiment may include at least one foreign matter outlets 1561 or 1562 for releasing foreign matter.

The center bracket 1541 may have a predetermined length and width so as to be mounted in the hinge housing, and at least part of a lower portion of the center bracket 1541 may include a curved surface to correspond to the inside of the hinge housing 150. The center bracket 1541 may include a first rail part 1541a in which the first hinge bracket 1521 is mounted to perform hinge motion, a second rail part 1541b in which the second hinge bracket 1522 is mounted to perform hinge motion, and a bracket body 1542 having the first rail part 1541a formed on one side thereof and the second rail part 1541b formed on an opposite side thereof. Boss holes areas 1551 and 1552 used to fix the first hinge structure 200a to the hinge housing 150 may be formed on opposite edges of the bracket body 1542. After the first hinge structure 200a is coupled to the hinge housing 150, the foreign matter collection members 501 and 502 may be disposed on the boss hole areas 1551 and 1552.

The first hinge bracket 1521 may have a semi-circular cross-section, and the first hinge bracket 1521 may be inserted into the first rail part 1541a in a first rotational direction and may be disposed to perform hinge motion in the first rotational direction that is the same as the direction in which the first hinge bracket 1521 is inserted into the first rail part 1541a. A first stopper 4141 formed on the center bracket 1541 may operate to prevent the first hinge bracket 1521 from rotating through at least a specified angle (e.g., 0 or 180 degree) in the first rotational direction, and thus the first hinge bracket 1521 may not be separated from the center bracket 1541.

The second hinge bracket 1522 may have substantially the same structure and size as the first hinge bracket 1521. For example, the second hinge bracket 1522 may have a semi-circular cross-section. The second hinge bracket 1522 may be inserted into the second rail part 1541b in a second rotational direction and may be disposed to perform hinge motion in the second rotational direction. A second stopper 4142 formed on the center bracket 1541 may operate to prevent the second hinge bracket 1522 from rotating through at least a specified angle (e.g., 180 or 0 degree) in the second rotational direction, and thus the second hinge bracket 1522 may not be separated from the center bracket 1541.

The foreign matter outlets 1561 and 1562 may include the first foreign matter outlet 1561 disposed in an adjacent area of the center bracket 1541 into which the first hinge bracket 1521 is inserted and the second foreign matter outlet 1562 disposed in an adjacent area of the center bracket 1541 into which the second hinge bracket 1522 is inserted. The foreign matter outlets 1561 and 1562 may be formed through front and rear surfaces of the center bracket 1541. Accordingly, foreign matter introduced to a higher location than the first hinge structure 200a or the second hinge structure 200b may be moved to a lower location than the first hinge structure 200a or the second hinge structure 200b through the foreign matter outlets 1561 and 1562.

For example, foreign matter introduced to a higher location than the first hinge structure 200a may be moved to the inside of the hinge housing 150 through the first foreign matter outlet 1561 and may be fixed by the first foreign matter collection member 521 described above with reference to FIG. 4. Similarly, foreign matter introduced to a higher location than the second hinge structure 200b may be moved to the inside of the hinge housing 150 through the second foreign matter outlet 1562 and may be fixed by the second foreign matter collection member 522 described above with reference to FIG. 4.

The foreign matter outlets 1561 and 1562 may be disposed adjacent or contiguous to the first rail part 1541a used to rotate the first hinge bracket 1521 and the second rail part 1541b used to rotate the second hinge bracket 1522. The foreign matter outlets 1561 and 1562 may have any shape formed through the front and rear surfaces of the center bracket 1541. For example, the foreign matter outlets 1561 and 1562 may be vertically formed through the front and rear surfaces of the center bracket 1541 and may have a circular or polygonal (e.g., rectangular or triangular) cross-section. To enable release of foreign matter even when the first hinge bracket 1521 and the second hinge bracket 1522 are in a flat state, the foreign matter outlets 1561 and 1562 may be vertically formed through at least parts of surrounding areas where in the flat state, the first hinge bracket 1521 and the second hinge bracket 1522 are mounted in the first rail part 1541*a* and the second rail part 1541*b*.

Figure 6:
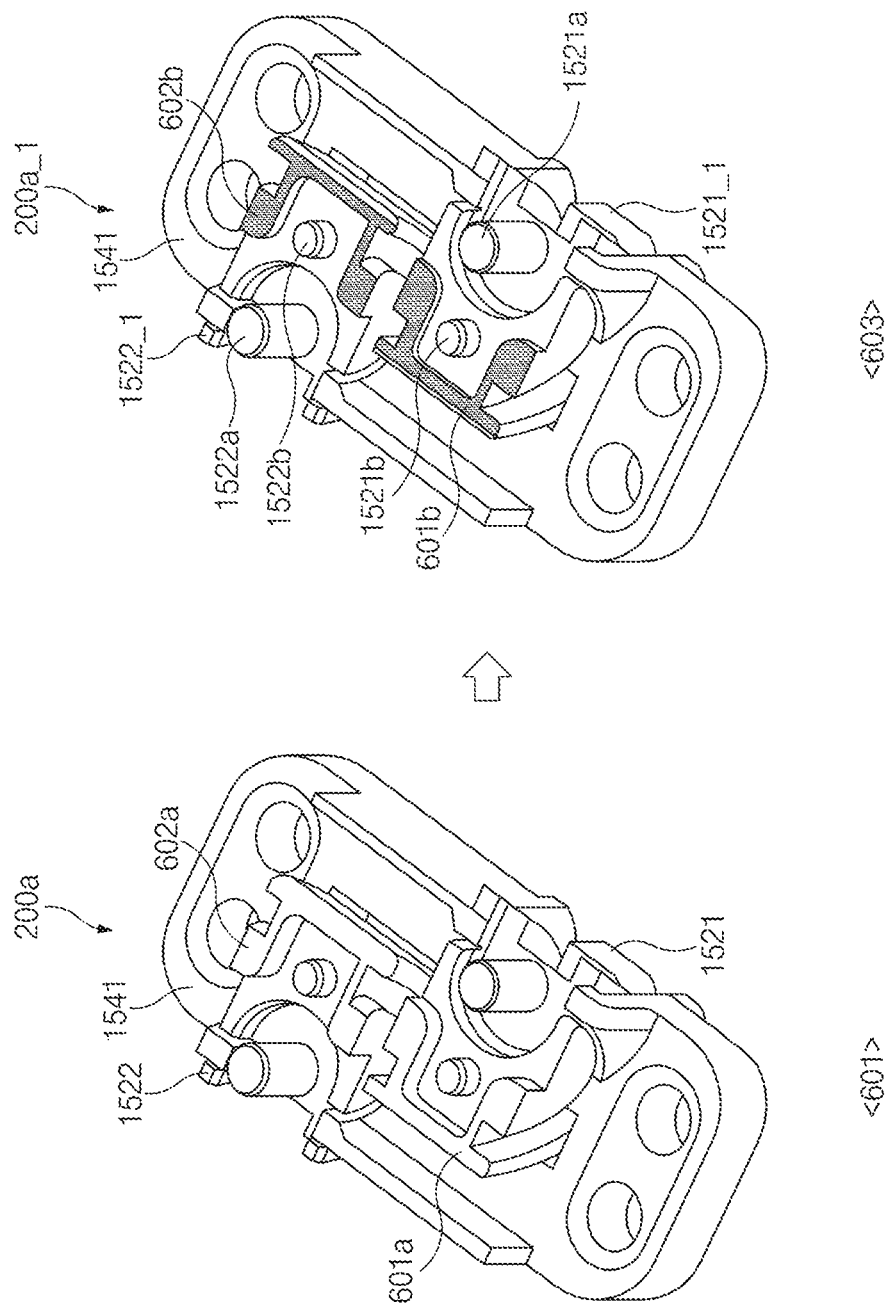
FIG. 6 illustrates a modified example of the first hinge structure or the second hinge structure according to an embodiment.

FIG. 6 illustrates a modified example of the first hinge structure or the second hinge structure according to an embodiment. Referring to FIG. 6, the first hinge structure 200*a* (or the second hinge structure 200*b*, although the following description is given based on the first hinge structure 200*a*) may include the first hinge bracket 1521, the second hinge bracket 1522, and the center bracket 1541. The first hinge bracket 1521 may be coupled to the center bracket 1541 to perform motion from inside to outside (e.g., in the first rotational direction) with respect to the horizontal center line of the center bracket 1541 and may be coupled with the first hinge plate 141 based on first coupling protrusions 1521*a* and 1521*b*.

Accordingly, while the first hinge bracket 1521 performs hinge motion, the first hinge plate 141 may be mounted at a predetermined angle depending on the rotary motion of the first hinge bracket 1521. The second hinge bracket 1522 may be disposed adjacent to the first hinge bracket 1521 and may be coupled to the center bracket 1541 to perform motion from inside to outside (e.g., in the second rotational direction opposite to the first rotational direction) with respect to the horizontal center line of the center bracket 1541 and may be coupled with the second hinge plate 142 based on second coupling protrusions 1522*a* and 1522*b*. Accordingly, while the second hinge bracket 1522 performs hinge motion, the second hinge plate 142 may be mounted at a predetermined angle depending on the rotary motion of the second hinge bracket 1522.

Figure 7:
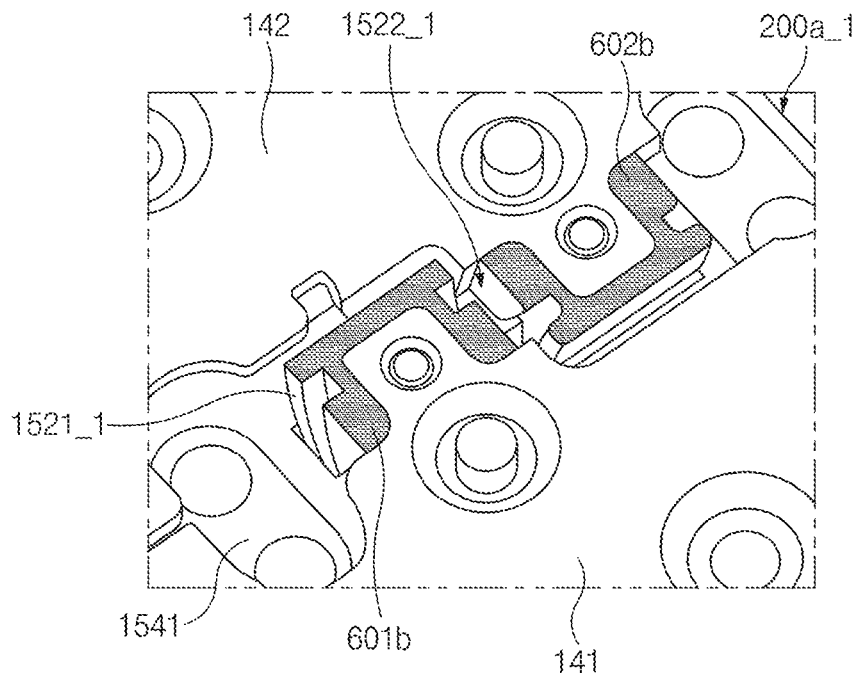
FIG. 7 illustrates some components of the electronic device on which is mounted the modified first or second hinge structure, according to an embodiment.

FIG. 7 illustrates some components of the electronic device on which is mounted the modified first or second hinge structure, according to an embodiment.

Referring to FIGS. 6 and 7, a portion 601*a* of an upper surface facing the rear surface of the display 110 of the first hinge bracket 1521 in state 601 may be lowered by a certain height as in state 603 to form a portion 601*b* of a modified first hinge bracket 1521_1. Similarly, a portion 602*a* of an upper surface facing the rear surface of the display 110 of the second hinge bracket 1522 in state 601 may be lowered by the specified height as in state 603 to form a portion 602*b* of a modified second hinge bracket 1522_1, and therefore, may have the same height as the modified portion 601*b* of the modified first hinge bracket 1521_1.

At least part of an upper surface of a modified first hinge structure 200*a*_1 may be formed to be lower than at least part of an upper surface of the first hinge structure 200*a* by the specified height, relative to the surface of the first hinge plate 141 or the second hinge plate 142. For example, the modified portion 601*b* of the modified first hinge bracket 1521_1 may be formed to be lower than the surrounding first hinge plate 141 by the specified height. The portion 602*b* of the modified second hinge bracket 1522_1 may be formed to be lower than the second hinge plate 142 by the specified height. Accordingly, when the first hinge plate 141 and the second hinge plate 142 are in a flat state (e.g., when one surface of the first hinge plate 141 and one surface of the second hinge plate 142 are disposed side by side while facing the rear surface of the display 110), the edge portion 601*b* of the modified first hinge bracket 1521_1 and the edge portion 602*b* of the modified second hinge bracket 1522_1 may be spaced apart from the rear surface of the display 110 at a specified interval.

Figure 8:
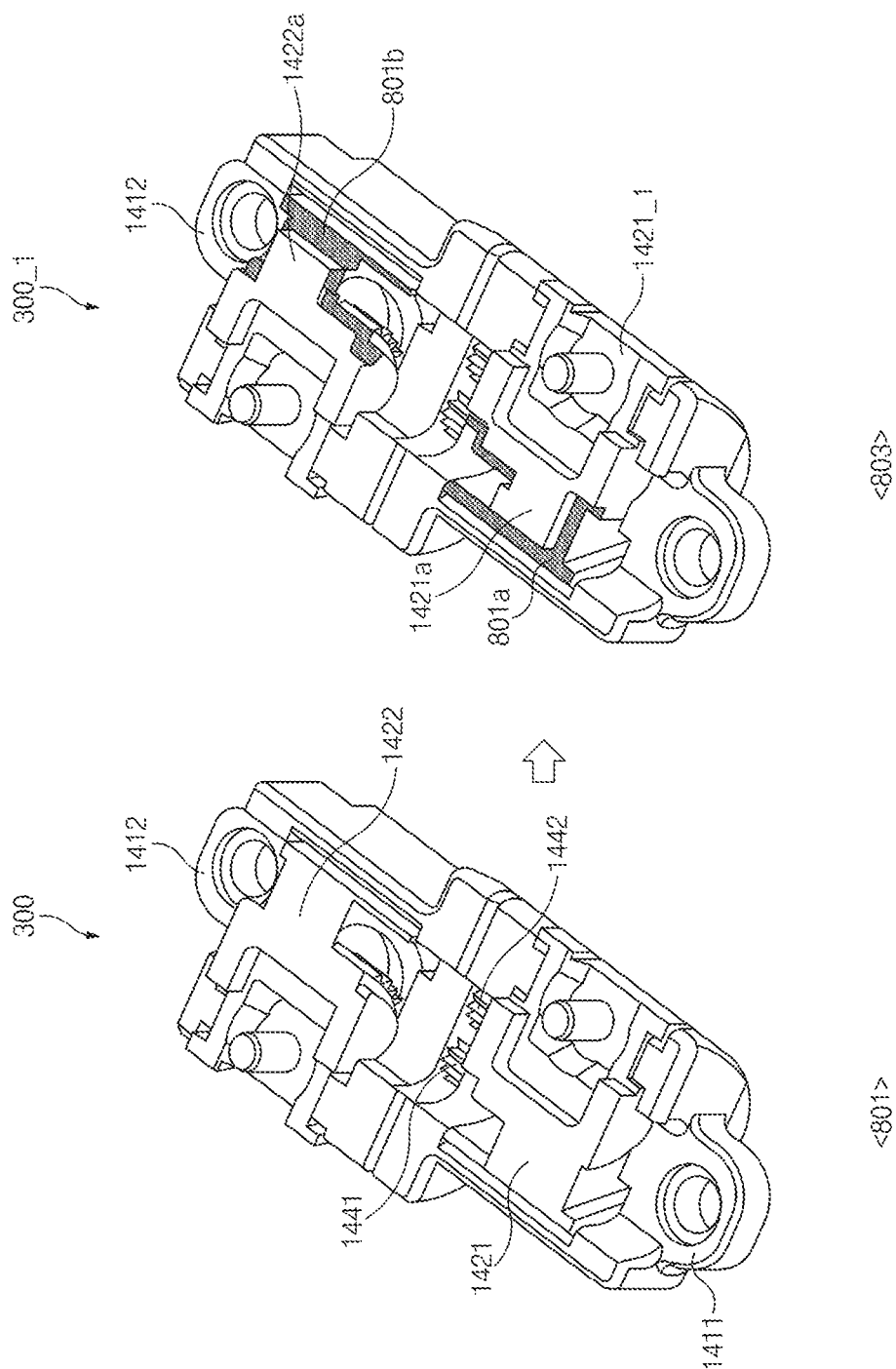
FIG. 8 illustrates a modified example of a third hinge structure according to an embodiment.

FIG. 8 illustrates a modified example of the third hinge structure according to an embodiment. Referring to FIG. 8, the third hinge structure 300 may include a first main bracket 1411, a second main bracket 1412, a first inner bracket 1421, a second inner bracket 1422, and at least one gears 1441 or 1442. The first inner bracket 1421 may be coupled to the first main bracket 1411 to perform motion from inside to outside (e.g., in the first rotational direction) with respect to the horizontal center line of the first main bracket 1411 and may be coupled with the first hinge plate 141. Accordingly, while the first inner bracket 1421 performs hinge motion, the first hinge plate 141 may be mounted at a predetermined angle depending on the rotary motion of the first inner bracket 1421.

The second main bracket 1412 may be disposed adjacent to the first main bracket 1411 and may be coupled with the second inner bracket 1422. The second inner bracket 1422 may be coupled to the second main bracket 1412 to perform motion from inside to outside (e.g., in the second rotational direction opposite to the first rotational direction) with respect to the horizontal center line of the second main bracket 1412 and may be coupled with the second hinge plate 142. Accordingly, while the second inner bracket 1422 performs hinge motion, the second hinge plate 142 may be mounted at a predetermined angle depending on the rotary motion of the second inner bracket 1422.

The at least two gears 1441 and 1442 may connect the first inner bracket 1421 and the second inner bracket 1422. Accordingly, force generated during rotation of the first inner bracket 1421 may be transmitted to the second inner bracket 1422 through the at least two gears 1441 and 1442, and vice versa.

A portion of an upper surface facing the rear surface of the display 110, of the first inner bracket 1421 illustrated in state 801 may be lowered by a specified height as illustrated in state 803 to form a portion 801*a* of a modified first inner bracket 1421*a*. Similarly, a portion of an upper surface facing the rear surface of the display 110, of the second inner bracket 1422 illustrated in state 801 may be lowered by the specified height as illustrated in state 803 to form a portion 801*b* of a modified second inner bracket 1422*a*. For example, at least part of an upper surface of a modified third hinge structure 300_1 may be formed to be lower than at least part of an upper surface of the third hinge structure 300 by the specified height. The modified portions 801*a* and 802*a* may be disposed to have the same height.

Figure 9:
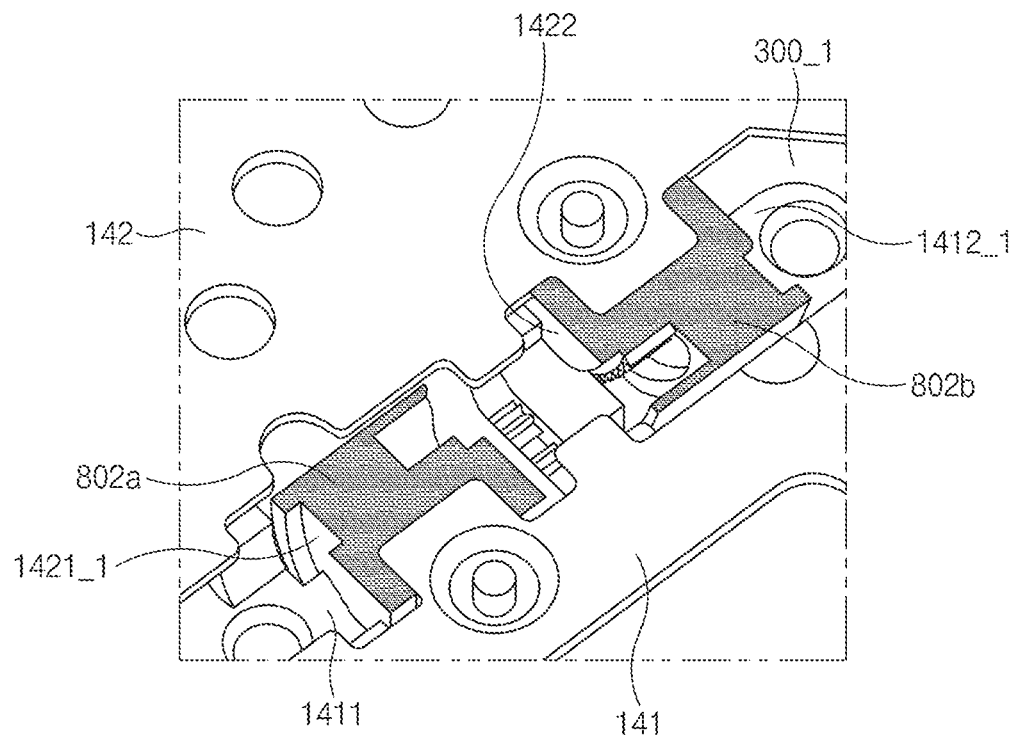
FIG. 9 illustrates some components of the electronic device on which is mounted the modified third hinge structure according to an embodiment.

FIG. 9 illustrates some components of the electronic device on which is mounted the modified third hinge structure, according to an embodiment.

Referring to FIG. 9, the remaining portion 802*a* of the upper surface of the first inner bracket 1421 other than the portion coupled with the first hinge plate 141 may be formed to be lower than the surrounding first hinge plate 141. Similarly, the remaining portion 802*b* of the upper surface of the second inner bracket 1422 other than the portion coupled with the second hinge plate 142 may be formed to be lower than the surrounding second hinge plate 142.

Figure 10:
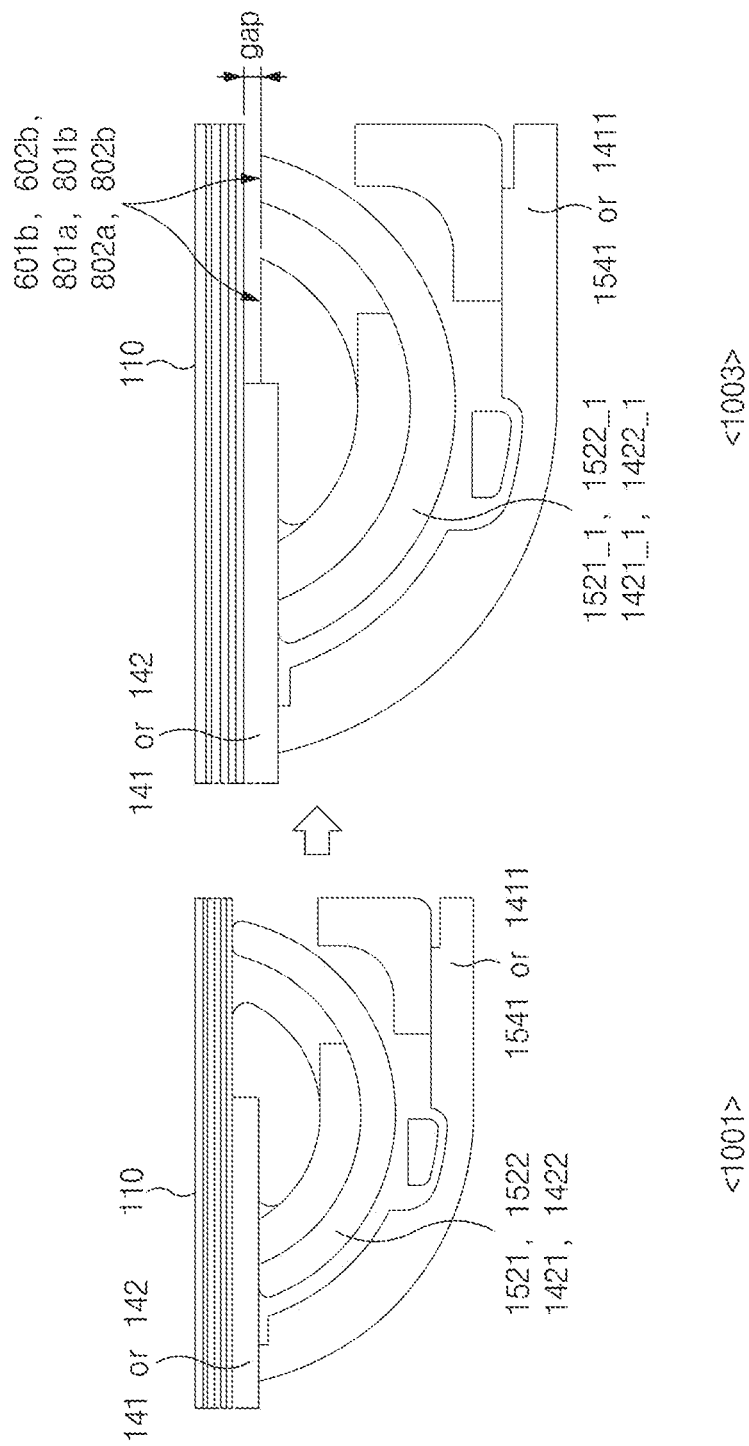
FIG. 10 illustrates one of cross-sections of modified forms of the hinge structures according to an embodiment.

FIG. 10 illustrates one of cross-sections of modified forms of the hinge structures according to an embodiment. In FIG. 10, one of cross-sections of areas including the portions 601*b*, 602*b*, 801*a*, 801*b*, 802*a*, and 802*b* included in the hinge brackets is illustrated based on a state in which the hinge plate 141 or 142 and the display 110 are disposed on the hinge structures described above with reference to FIGS. 6 to 9.

Referring to FIG. 10, in state 1001, the upper surface of at least one of the first hinge bracket 1521, the second hinge bracket 1522, the first inner bracket 1421, and the second inner bracket 1422 may be disposed to have the same height as the surrounding hinge plate 141 or 142 when the foldable electronic device 100 is in a flat state. Accordingly, the upper surface of at least one of the first hinge bracket 1521, the second hinge bracket 1522, the first inner bracket 1421, and the second inner bracket 1422 may be disposed to make contact with the rear surface of the display 110 when the foldable electronic device 100 is in the flat state.

When at least part of the upper surface of at least one of the first hinge bracket 1521, the second hinge bracket 1522, the first inner bracket 1421, and the second inner bracket 1422 is stained with foreign matter, such as grease or sand as examples, the foreign matter may be moved to the rear surface of the display 110 due to contact between the rear surface of the display 110 and the upper surface of at least one of the first hinge bracket 1521, the second hinge bracket 1522, the first inner bracket 1421, and the second inner bracket 1422. In this case, the foreign matter may cause damage to the rear surface of the display 110, or the visibility of the display 110 from the outside may be reduced, such that the foreign matter may appear as a stain.

As described above with reference to FIGS. 6, 8, and 9, portions of the hinge structures of the foldable electronic device 100 may be formed to be lower than the surroundings depending on modification. In this case, as in state 1003, portions (e.g., 601b, 602b, 801a, 801b, 802a, and 802b) of the modified first hinge bracket 1521_1, the modified second hinge bracket 1522_1, the modified first inner bracket 1421a, and the modified second inner bracket 1422a may be spaced apart from the rear surface of the display 110 by a specified gap even when the modified first hinge bracket 1521_1, the modified second hinge bracket 1522_1, the modified first inner bracket 1421a, and the modified second inner bracket 1422a are in a flat state. Accordingly, even when foreign matter is on the portions of the modified first hinge bracket 1521_1, the modified second hinge bracket 1522_1, the modified first inner bracket 1421a, and the modified second inner bracket 1422a, the foreign matter may not have a particular adverse influence on the rear surface of the display 110 due to the gap.

Figure 11A:
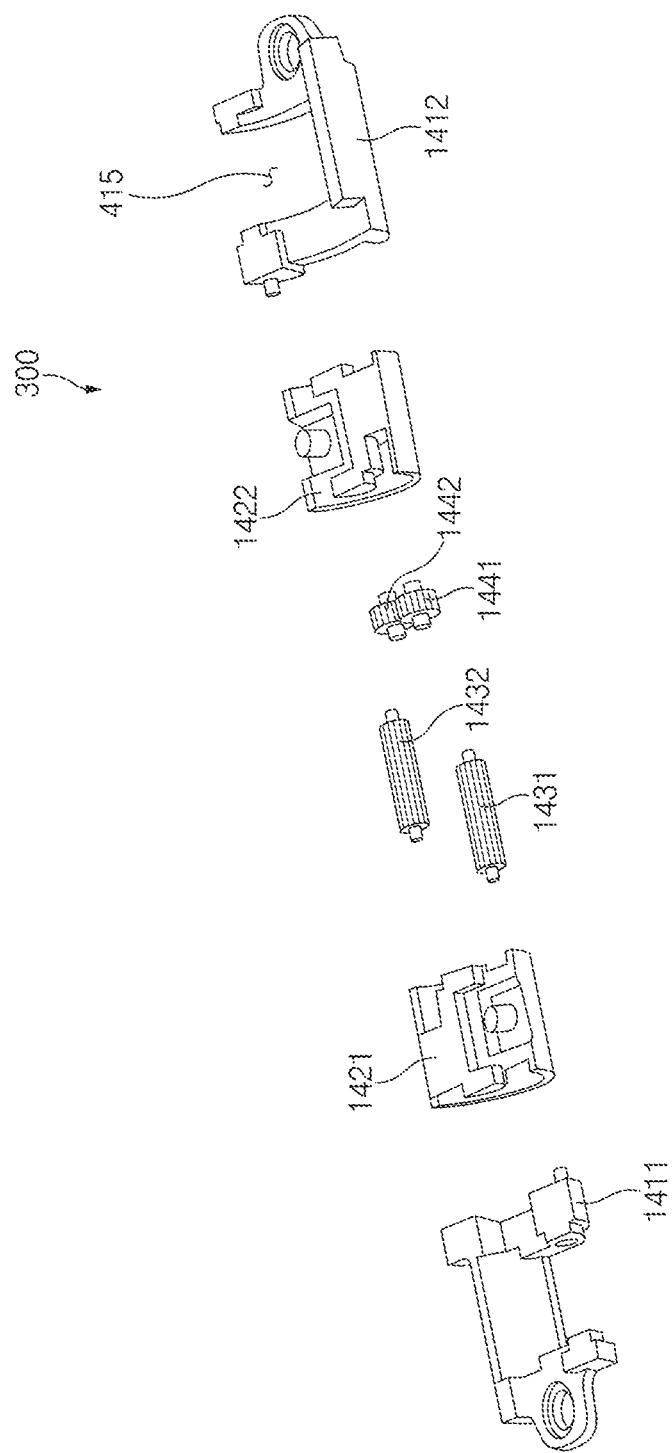
FIG. 11A illustrates an exploded perspective view of the third hinge structure of the foldable electronic device according to an embodiment.
Figure 11B:
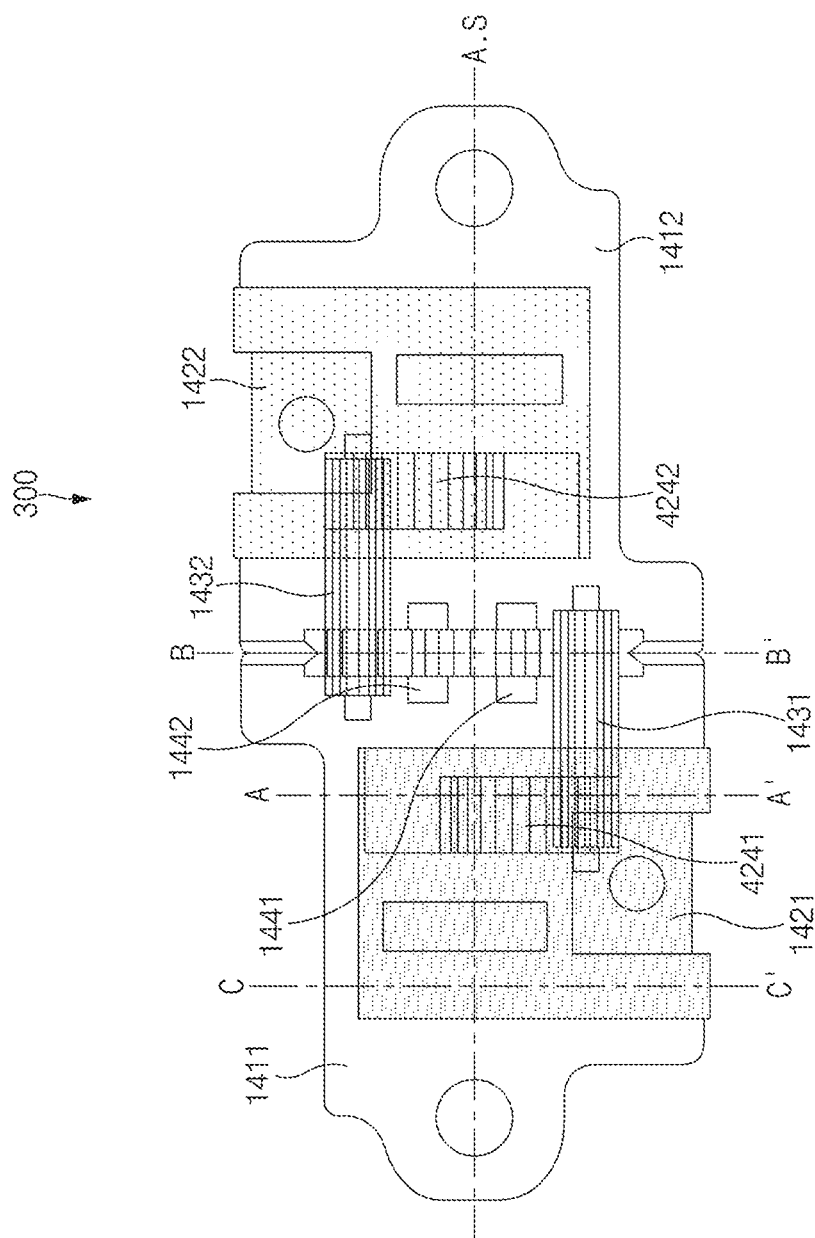
FIG. 11B illustrates the third hinge structure of the foldable electronic device in a flat state according to an embodiment.

FIG. 11A illustrates an exploded perspective view of the third hinge structure of the foldable electronic device according to an embodiment. FIG. 11B illustrates the third hinge structure of the foldable electronic device in a flat state.

Referring to FIGS. 11A and 11B, main brackets 1411 and 1412 of the third hinge structure 300 may each have an insertion space 415 surrounded by a plurality of inner walls, and inner brackets 1421 and 1422 may be inserted into the insertion spaces 415, respectively. Accordingly, removal of the assembled parts may be prevented even though an impact is applied to the electronic device 100, and the number of parts may be decreased, which results in reducing failure or defect rate.

In this regard, in the third hinge structure 300 connecting a plurality of housings of the electronic device, the plurality of main brackets 1411 and 1412 may each include the insertion space 415 surrounded by the plurality of inner walls, the plurality of inner brackets 1421 and 1422 may be inserted into the insertion spaces 415 to rotate along predetermined rotational paths and may include internal gears 4241 and 4242 therein, respectively, and at least one main gears 1431 or 1432 may be engaged with the internal gears 4241 and 4242 and may rotate together when the plurality of inner brackets 1421 and 1422 rotate.

The main brackets 1411 and 1412 may be fixed to the hinge housing 150 and may serve as a body of the third hinge structure 300 to which other parts are assembled. The main brackets 1411 and 1412 may each include the insertion space 415 surrounded by the plurality of inner walls. The two main brackets 1411 and 1412 may be formed. However, the number of main brackets is not limited thereto, and three or more main brackets may be formed.

The inner brackets 1421 and 1422 may be inserted into the insertion spaces 415 included in the main brackets 1411 and 1412 and may be fixed to the first and second housings 121 and 122 to rotate the first and second housings 121 and 122. The inner brackets 1421 and 1422 may include the internal gears 4241 and 4242 therein, respectively. As illustrated, the two inner brackets 1421 and 1422 may be formed. However, the number of inner brackets is not limited thereto, and three or more inner brackets may be formed.

The third hinge structure 300 may further include the main gears 1431 and 1432 and idle gears 1441 and 1442. The idle gears 1441 and 1442 may be engaged with the at least two main gears 1431 and 1432 and may connect the plurality of main brackets 1411 and 1412. Accordingly, the idle gears 1441 and 1442 may transmit rotational power of the first main gear 1431 to the second main gear 1432. Without being limited thereto, however, the third hinge structure 300 may not include the idle gears 1441 and 1442. In this case, the plurality of main brackets 1411 and 1412 may be disposed to be directly engaged with each other.

For example, the plurality of inner walls of each of the main brackets 1411 and 1412 may include a pair of inner walls disposed on opposite sides in the direction of axes of rotation A.R.I 1 and A.R.I. 2 (see FIG. 11C, described below) of the inner brackets 1421 and 1422 to face each other. When the first inner bracket 1421 rotates, the rotational power may be transmitted to the first internal gear 4241, the first main gear 1431, the first idle gear 1441, the second idle gear 1442, the second main gear 1432, and the second internal gear 4242, and thus the second inner bracket 1422 may also rotate.

Figure 11C:
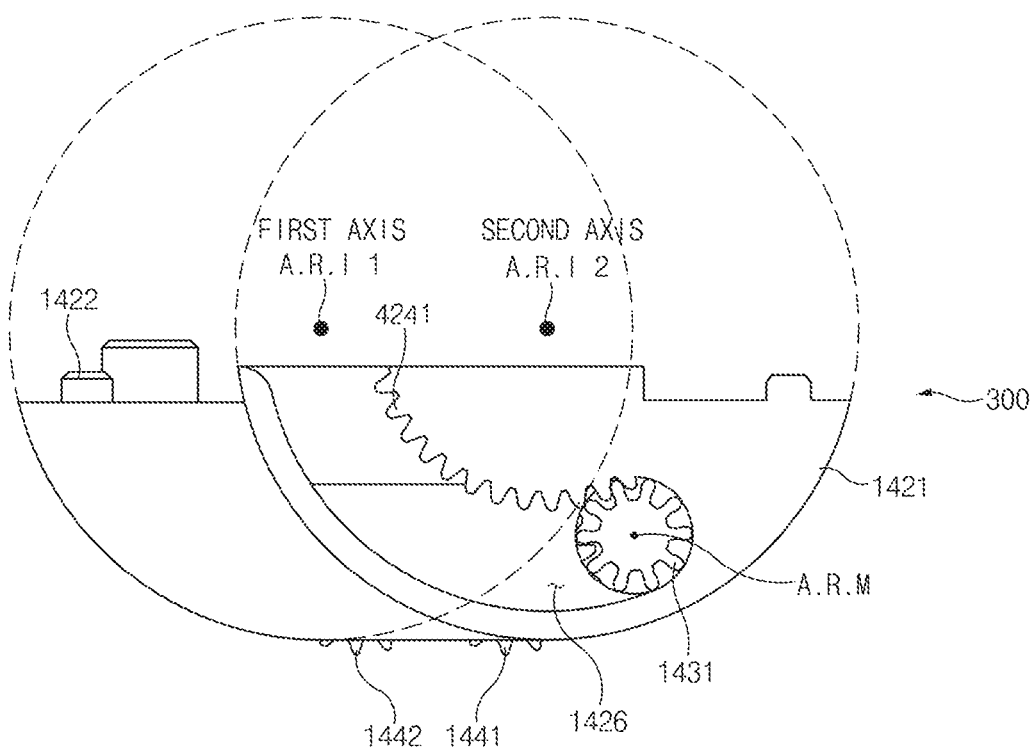
FIG. 11C is a sectional view of the third hinge structure taken along line A-A' of FIG. 11B.

FIG. 11C is a sectional view of the third hinge structure 300 taken along line A-A' of FIG. 11B.

Referring to FIGS. 11A, 11B and 11C, the first housing structure 121 and the second housing structure 122 of the electronic device 100 may be connected to rotate relative to each other. For example, when a user rotates the first or second housing structure 121 or 122 to fold the electronic device in an unfolded state (or a flat state), the inner brackets 1421 and 1422 fixed to the first and second housing structures 121 and 122 through the hinge plates 141 and 142 may rotate about the axes of rotation A.R.I along the predetermined rotational paths. Because the inner brackets 1421 and 1422 are fixed to the first and second housing structures 121 and 122, the rotational paths of the inner brackets 1421 and 1422 may correspond to the paths along which the first and second housing structures 121 and 122 are folded or unfolded. In another example, the axes of rotation A.R.I 1 and A.R.I. 2 of the inner brackets 1421 and 1422 may be in agreement with the axes of rotation of the first and second housing structures 121 and 122 fixed to the inner brackets 1421 and 1422 and may be parallel to the axis of symmetry A.S of the first and second housing structures 121 and 122.

According to an embodiment, circles with a predetermined radius may be drawn about the axes of rotation A.R.I of the inner brackets 1421 and 1422 as illustrated in FIG. 11C. To minimize interference when the inner brackets 1421 and 1422 rotate, lower surfaces of the inner brackets 1421 and 1422 may have arc shapes existing on the circles. For example, the lower surfaces of the inner brackets 1421 and 1422 may have arc shapes having the axes of rotation A.R.I 1 and A.R.I. 2 of the inner brackets 1421 and 1422 as center points.

The inner brackets 1421 and 1422 may be disposed in the main brackets 1411 and 1412 and may include moving spaces 1426 in which the main gears 1431 and 1432 are capable of moving. The moving spaces 1426 may be moved while having arc shapes with the axes of rotation A.R.I 1, A.R.I. 2 of the inner brackets 1421 and 1422 as center points.

The inner brackets 1421 and 1422 may include the internal gears 4241 and 4242 that are engaged with gears of the main brackets 1411 and 1412. Accordingly, when the inner brackets 1421 and 1422 rotate, the internal gears 4241 and 4242 may rotate the main gears 1431 and 1432. At this time, the internal gear 4241 may have an arc shape with the axis of rotation A.R.I. 2 of the inner bracket 1421 as the center point.

Gear teeth of the internal gears 4241 and 4242 may protrude toward the moving spaces 1426. The gear teeth of the internal gears 4241 and 4242 may protrude from inner circumferential surfaces of the moving spaces 1426 in the radial directions with respect to the axes of rotation A.R.I 1 and A.R.I 2 of the inner brackets 1421 and 1422. Without being limited thereto, however, the gear teeth of the internal gears 4241 and 4242 may protrude from outer circumferential surfaces of the moving spaces 1426 in the directions toward the axes of rotation A.R.I 1 and A.R.I 2 of the inner brackets 1421 and 1422.

Figure 11D:
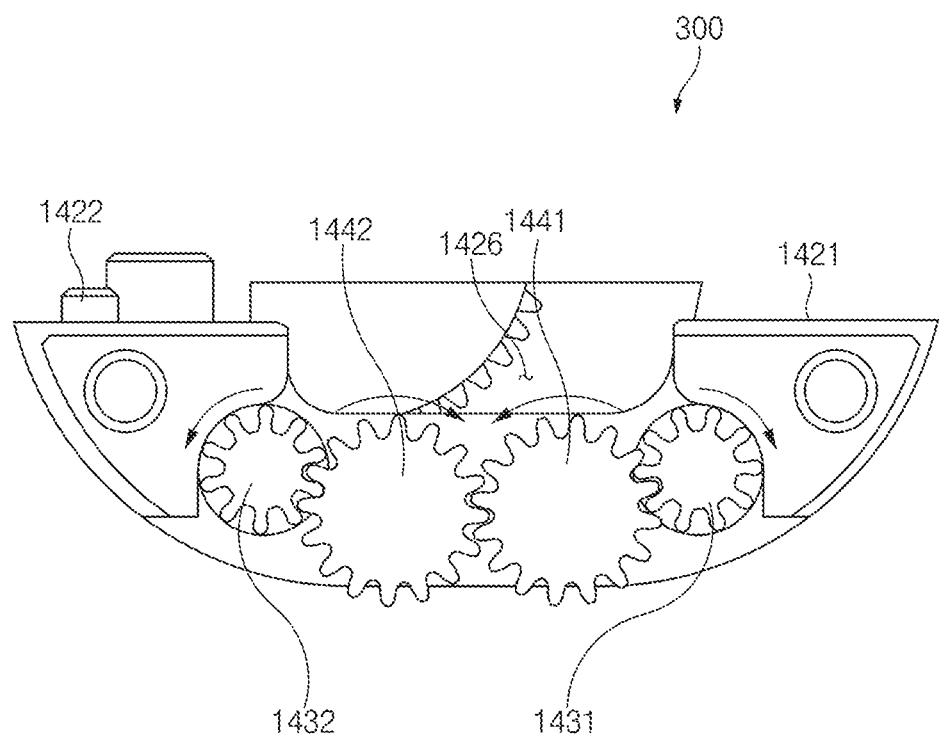
FIG. 11D is a sectional view of the third hinge structure taken along line B-B' of FIG. 11B.

FIG. 11D is a sectional view of the third hinge structure 300 taken along line B-B' of FIG. 11B.

Referring to FIGS. 11A to 11D, when the first housing structure 121 rotates, the first inner bracket 1421 fixed to the first housing structure 121 through the first hinge plate 141 of FIG. 2 may rotate. Then, the first internal gear 4241 included in the first inner bracket 1421 and engaged with the first main gear 1431 may be rotated.

As illustrated in FIG. 11D, the first main gear 1431, the first idle gear 1441, the second idle gear 1442, and the second main gear 1432 may be sequentially engaged with one another. Accordingly, rotational power of the first main gear 1431 may be transmitted to the first idle gear 1441, the second idle gear 1442, and the second main gear 1432.

Figure 11E:
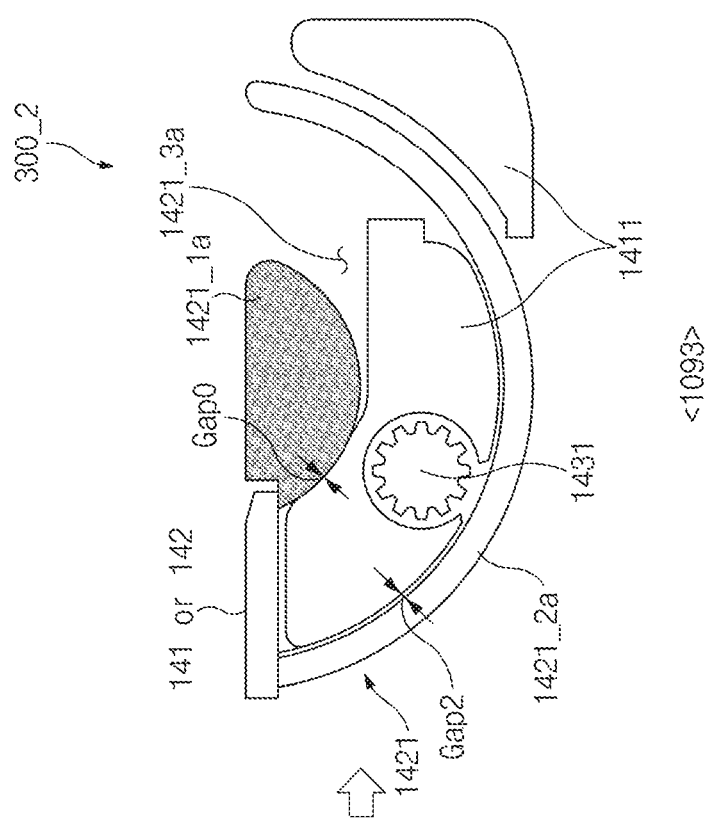
FIG. 11E is a sectional view of the third hinge structure taken along line C-C' of FIG. 11B.
Figure 11E:
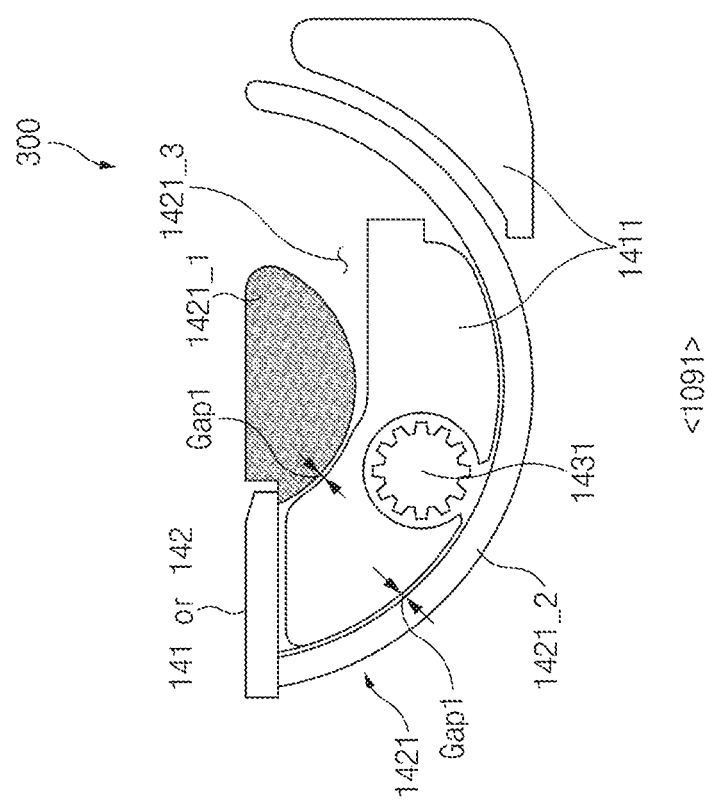

FIG. 11E is a sectional view of the third hinge structure 300 taken along line C-C' of FIG. 11B.

Referring to FIGS. 11A to 11E, in the third hinge structure 300, the first main bracket 1411 and the first inner bracket 1421 may be disposed to have a predetermined tolerance (e.g., a first gap Gap1) as in state 1091. The first inner bracket 1421 may include a moving space 1421_3 as described above. The moving space 1421_3 may be formed by an upper rail 1421_1 formed in the first inner bracket 1421 and a lower rail 1421_2 spaced apart from the upper rail 1421_1 at a specified interval, in which at least part of the inside of the lower rail 1421_2 has an arc shape corresponding to an arc shape of the moving space 1421_3. A partial surface of the first main bracket 1411 disposed on one side of the moving space 1421_3 may be spaced apart from an upper surface of the lower rail 1421_2 by the first gap Gap1. An upper surface of the first main bracket 1411 disposed on the one side of the moving space 1421_3 may be spaced apart from a lower surface of the upper rail 1421_1 by the first gap Gap1. The first gap Gap1 may be changed while the first inner bracket 1421 rotates.

In state 1093, a modified third hinge structure 300_2 may be configured to minimize the first gap Gap1. For example, the modified third hinge structure 300_2 may include at least one of a modified upper rail 1421_1a, a modified lower rail 1421_2a, and a modified moving space 1421_3a. The interval between the modified upper rail 1421_1a and the modified lower rail 1421_2a may vary depending on at least one of the modified upper rail 1421_1a, the modified lower rail 1421_2a, and the modified moving space 1421_3a. Accordingly, a second gap Gap2 may be formed between a lower surface of the first main bracket 1411 and an upper surface of the modified lower rail 1421_2a. The second gap Gap2 may be smaller than the first gap Gap1. A third gap Gap0 may be formed between an upper surface of the first main bracket 1411 and a lower surface of the modified upper rail 1421_1a. The third gap Gap0 may be zero. For example, the upper surface of the first main bracket 1411 may be brought into contact with the lower surface of the modified upper rail 1421_1a. The second gap Gap2 and the third gap Gap0 described above may be modified depending on a movement of the first inner bracket 1421.

Figure 12:
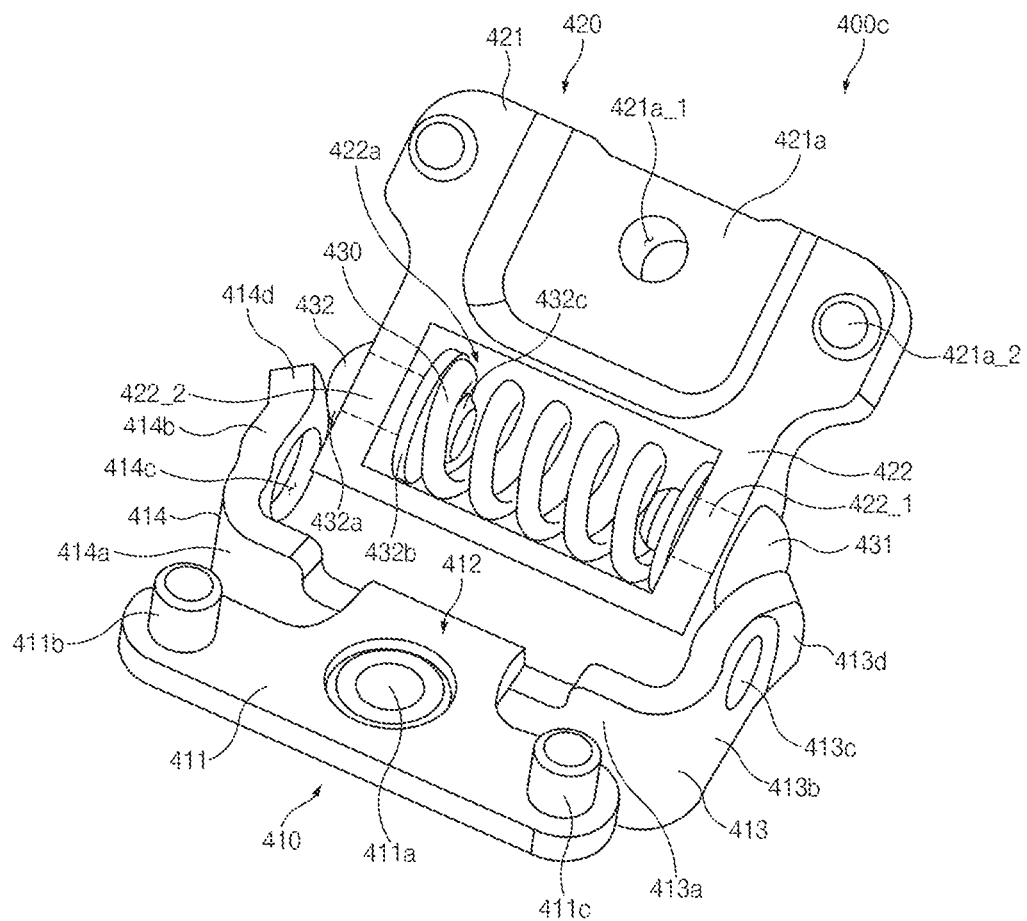
FIG. 12 illustrates a detent structure according to an embodiment.

FIG. 12 illustrates a detent structure according to an embodiment.

Referring to FIGS. 2 and 12, the third detent structure 400c may include a first plate coupling part 410 and a second plate coupling part 420. Similar to the third detent structure 400c, the first detent structure 400a, the second detent structure 400b, and the fourth detent structure 400d may also include a first plate coupling part and a second plate coupling part.

The first plate coupling part 410 may be coupled with the first housing structure 121 through the first hinge plate 141. Alternatively, the first plate coupling part 410 may be coupled with the second housing structure 122 through the second hinge plate 142. At least part of the first plate coupling part 410 may be formed of a metallic material (e.g., stainless steel (SUS), aluminum, or an alloy thereof), or at least part of the first plate coupling part 410 may be formed of a non-metallic material (e.g., plastic). The first plate coupling part 410 may include a first coupling body 411, a bridge 412, a first support portion 413, and a second support portion 414.

The first coupling body 411 may have a bar or rod shape with a predetermined thickness that has a specified first length in first axis directions (x,−x) and a second length in second axis directions (y,−y) and has rounded edges or corners. In one embodiment, a first rivet hole 411b may be disposed near an edge of the first coupling body 411 that faces a first direction (−x), a second rivet hole 411c may be disposed near an edge of the first coupling body 411 that faces a second direction (x), and a first coupling hole 411a may be disposed in the center of the first coupling body 411. The first rivet hole 411b may be disposed to pass through a hole formed on one side of the first hinge plate 141 or the second hinge plate 142, and in a rivet process, a first rivet may be coupled to the first rivet hole 411b to fix the first hinge plate 141 or the second hinge plate 142 to the first coupling body 411. The second rivet hole 411c may be disposed to pass through a hole formed on one side of the second hinge plate 142 or the first hinge plate 141, and in a rivet process, a second rivet may be coupled to the second rivet hole 411c to fix the second hinge plate 142 or the first hinge plate 141 to the first coupling body 411.

The bridge 412 may have a specified width and may extend from the central portion of the first coupling body 411 by a predetermined length in a third direction (−y). A portion of the first coupling hole 411a may be disposed on one side of the bridge 412. The first support portion 413 and the second support portion 414 may be connected to an end of the bridge 412.

One side of the first support portion 413 may extend from the bridge 412, and the first support portion 413 may have an overall reversed "L" shape. The first support portion 413 may include a first wing 413a, a second wing 413b, a first mounting hole 413c, and a first curved portion 413d. The first mounting hole 413c may be formed in the shape of a through-hole or a recess. The first wing 413a may have a predetermined width and may extend from the bridge 412 in the second direction (x). The second wing 413b may have a predetermined width and may extend from an end of the first wing 413a in the third direction (−y). The first mounting hole 413c may be formed through the second wing 413b (e.g., in the first axis directions (x,−x)) and may have a predetermined size. The first curved portion 413d may be bent with a specified curvature from an end of the second wing 413b in the second direction (x) (e.g., in the same direction as the direction in which the first wing 413a extends from the end of the bridge 412). The first curved portion 413d may allow a first mounting part 431 to be smoothly inserted toward the inside of the first support portion 413 while the first plate coupling part 410 and the second plate coupling part 420 are coupled together. The first curved portion 413d may serve to guide a movement of the first mounting part 431 toward the first mounting hole 413c while the first mounting part 413 is inserted into the first mounting hole 413c. The first plate coupling part 410 and the second plate coupling part 420 may rotate depending on rotation of the first housing structure 121 and the second housing structure 122, and the first curved portion 413d may be formed to protrude, or to be bent, by a specified height in a direction inclined by a specified angle from the −y axis to the −x axis to allow the first mounting part 431 to be smoothly inserted toward the inside of the first support portion 413.

The second support portion 414 may extend from the bridge 412 in the first direction (−x) and may have an overall "L" shape that is symmetric to the first support portion 413 with respect to the second axis directions (y,−y). The second support portion 414 may include a third wing 414a, a fourth wing 414b, a second mounting hole 414c, and a second curved portion 414d. The second mounting hole 414c may be formed in the shape of a through-hole or a recess. The third wing 414a may have a predetermined width and may extend from the end of the bridge 412 in the first direction (−x). The fourth wing 414b may have a predetermined width and may extend from an end of the third wing 414a in the third direction (−y). The second mounting hole 414c may be formed through the fourth wing 414b. The second curved portion 414d may be formed at an end of the fourth wing 414b so as to be symmetric to the first curved portion 413d with respect to the second axis directions (y,−y). The fourth wing 414b and the second wing 413b may be disposed to be symmetric to each other with respect to the second axis directions (y,−y), of which the first curved portion 413d and the direction in which the first curved portion 413d is bent may be symmetric to the second curved portion 414d and the direction in which the second curved portion 414d is bent.

The second plate coupling part 420 may be coupled with the second housing structure 122 through the second hinge plate 142. When the first plate coupling part 410 is coupled with the second housing structure 122 through the second hinge plate 142, the second plate coupling part 420 may be coupled with the first housing structure 121 through the first hinge plate 141. The second plate coupling part 420 may be brought into contact with, or spaced apart from, the first plate coupling part 410 depending on the angle between the second housing structure 122 and the first housing structure 121. At least part of the second plate coupling part 420 may be formed of a metallic material or the same material as that of the first plate coupling part 410. At least part of the second plate coupling part 420 may be formed of a metallic or a non-metallic material.

The second plate coupling part 420 may include a second coupling body 421, a mounting body 422, an elastic member 430, and mounting parts 431 and 432. The second coupling body 421 and the mounting body 422 may be integrated with each other. The second coupling body 421 and the mounting body 422 may be formed of the same material as that of the first coupling body 411 and/or the support portions 413 and 414.

The second coupling body 421 may have a predetermined thickness and width and may be formed of a metallic material. The second coupling body 421 may include a plate mounting portion 421a that is formed in a lower position than a surrounding portion by a specified height and on which the second hinge plate 142 or the first hinge plate 141 is mounted, a second coupling hole 421a_1 formed on the plate mounting portion 421a and used to couple the second hinge plate 142 or the first hinge plate 141, and at least one coupling protrusion 421a_2 that is formed on the surrounding portion formed in a higher position than the plate mounting portion 421a by the specified height and that is used to couple the second hinge plate 142 or the first hinge plate 141. The plate mounting portion 421a may be concavely formed to have a specified depth (e.g., the thickness of the hinge plate) in one direction (−z) such that the portion to which the first or second hinge plate 141 or 142 is coupled does not further protrude upward beyond the surrounding portion. The at least one coupling protrusion 421a_2 may be aligned with a recess or hole formed in the first or second hinge plate 141 or 142 and may prevent a movement of the first or second hinge plate 141 or 142. When the first or second hinge plate 141 or 142 is coupled to the second plate coupling part 420, the at least one coupling protrusion 421a_2 may serve to guide the first or second hinge plate 141 or 142 such that the first or second hinge plate 141 or 142 is mounted on the plate mounting portion 421a well.

The mounting body 422 may extend from the second coupling body 421 in a fourth direction (y), and the elastic member 430 and the mounting parts 431 and 432 may be mounted in the mounting body 422. For example, the mounting body 422 may have a step in the same direction (−z) as that of the step of the plate mounting portion 421a such that the elastic member 430 is mounted in the step, and may have a form corresponding to the external appearance of the elastic member 430. For example, the mounting body 422 may include an elastic member mounting portion 422a, at least part of which includes a curved surface to correspond to the external appearance of the elastic member 430 in the form of a coil spring. The mounting body 422 may have, in opposite sidewalls thereof, fixing holes 422_1 and 422_2 into which the mounting parts 431 and 432 are fixedly inserted. For example, the mounting body 422 may include the first fixing hole 422_1 that is formed in the sidewall facing the second direction (x) and that has a larger diameter than a protrusion of the first mounting part 431 and the second fixing hole 422_2 that is formed in the sidewall facing the first direction (−x) and that has a larger diameter than a protrusion of the second mounting part 432.

The elastic member 430 may be mounted in the elastic member mounting portion 422a of the mounting body 422 in the form of a coil spring or a plate spring shape. In the elastic member mounting portion 422a, the elastic member 430 may exert elastic force such that the first mounting part 431 and the second mounting part 432 are mounted in the second direction (x) and the first direction (−x).

The mounting parts 431 and 432 may be connected to opposite sides of the elastic member 430 and may be disposed to partly protrude in the second direction (x) and the first direction (−x) through the first fixing hole 422_1 and the second fixing hole 422_2 that are formed in the mounting body 422. For example, the second mounting part 432 or the first mounting part 431 may include a protrusion 432a including a predetermined curved surface, a flange 432b provided at the bottom of the protrusion 432a and having a larger diameter than the second fixing hole 422_2, and/or a column 432c inserted into one side of the elastic member 430. At least part of the protrusion 432a may protrude outside the mounting body 422 through the second fixing hole 422_2 and may be brought into contact with the first plate coupling part 410 depending on hinge motions of the housing structures 121 and 122. The flanges 432b of the mounting parts 431 and 432 may serve to support the mounting parts 431 and 432 such that the mounting parts 431 and 432 are not separated from the fixing holes 422_1 and 422_2. The columns 432c of the mounting parts 431 and 432 may support the elastic member 430 to prevent the mounting parts 431 and 432 from being separated from the elastic member 430 and prevent the elastic member 430 from being separated from the elastic member mounting portion 422a. At least part of at least one of the mounting parts 431 and 432 may be formed of a metallic or a non-metallic material.

The mounting parts 431 and 432 may make contact with the first curved portion 413d and the second curved portion 414d first in an operation of making contact with the first plate coupling part 410. In this state, the mounting parts 431 and 432 may remain in contact with the curved portions 413d and 414d when specified pressure is not added. Accordingly, the first housing structure 121 and the second housing structure 122 may be temporarily fixed at a specified first angle. When the specified pressure or more is added so that the mounting parts 431 and 432 are moved into the mounting body 422 through the fixing holes 422_1 and 422_2, at least part of the second plate coupling part 420 may be moved into the first plate coupling part 410. The mounting parts 431 and 432, when aligned with the mounting holes 413c and 414c, may be at least partially inserted into the mounting holes 413c and 414c while the portions of the mounting parts 431 and 432 pushed into the mounting body 422 are moved outside the fixing holes 422_1 and 422_2 by the elastic member 430. In this case, the first housing structure 121 and the second housing structure 122 may have a flat state.

According to an embodiment, an electronic device may include a first housing, a second housing, a display disposed on the first housing and the second housing, at least one hinge structure that connects the first housing and the second housing, a hinge housing that surrounds at least part of the at least one hinge structure, and at least one foreign matter collection member that is disposed on one side of the at least one hinge structure and that collects foreign matter introduced into the electronic device.

The at least one hinge structure may include a first hinge structure disposed at a left edge of the hinge housing and a second hinge structure disposed at a right edge of the hinge housing.

The at least one foreign matter collection member may be disposed on at least one of an upper side of the first hinge structure and an upper side of the second hinge structure.

The at least one foreign matter collection member may be disposed on at least one of a left edge and a right edge of the first hinge structure and at least one of a left edge and a right edge of the second hinge structure.

The at least one foreign matter collection member may be disposed on at least one of at least one boss hole area provided on one side of the first hinge structure and used to couple the first hinge structure and the hinge housing and at least one boss hole area provided on one side of the second hinge structure and used to couple the second hinge structure and the hinge housing.

At least one of the first hinge structure and the second hinge structure may include a center bracket, a first hinge bracket that is connected to the center bracket and that rotates in a first direction, and a second hinge bracket that is connected to the center bracket and that rotates in a second direction. A specified gap may be formed between at least part of the first hinge bracket and a rear surface of the display or between at least part of the second hinge bracket and the rear surface of the display when the first housing and the second housing are in a flat state.

The at least one hinge structure may include a first hinge structure disposed at a left edge of the hinge housing and a second hinge structure disposed at a right edge of the hinge housing. The at least one foreign matter collection member may be disposed in at least one of a space between the first hinge structure and the inside of the hinge housing and a space between the second hinge structure and the inside of the hinge housing.

At least one of the first hinge structure and the second hinge structure may include at least one foreign matter outlet that is formed through front and rear surfaces thereof and that induces the foreign matter toward the inside of the hinge housing.

The at least one hinge structure may include a third hinge structure disposed in the center of the hinge housing.

The at least one foreign matter collection member may be disposed between the third hinge structure and the inside of the hinge housing.

The third hinge structure may include main brackets, a first inner bracket and a second inner bracket that are coupled with the main brackets and that perform rotary motions in different directions, at least one idle gear engaged with internal gears of the first inner bracket and the second inner bracket, and main gears engaged with the at least one idle gear. A specified gap may be formed between at least part of the first inner bracket and a rear surface of the display or between at least part of the second inner bracket and the rear surface of the display when the first housing and the second housing are in a flat state.

The at least one hinge structure may include a first hinge structure disposed at a left edge of the hinge housing, a second hinge structure disposed at a right edge of the hinge housing, a third hinge structure disposed in the center of the hinge housing, and a first detent structure disposed between the first hinge structure and the third hinge structure. The at least one foreign matter collection member may be disposed between the first detent structure and the inside of the hinge housing.

The at least one hinge structure may include a first hinge structure 200a disposed at a left edge of the hinge housing, a second hinge structure disposed at a right edge of the hinge housing, a third hinge structure disposed in the center of the hinge housing, and at least one detent structure disposed between the second hinge structure and the third hinge structure. The at least one foreign matter collection member 542, 543, or 544 may be disposed between the at least one detent structure and the inside of the hinge housing.

The at least one hinge structure may include a first hinge structure disposed at a left edge of the hinge housing, a second hinge structure disposed at a right edge of the hinge housing, a third hinge structure disposed in the center of the hinge housing, a first detent structure disposed between the first hinge structure and the third hinge structure, and at least one second detent structure disposed between the second hinge structure and the third hinge structure. The at least one foreign matter collection member may be disposed between the inside of the hinge housing and the first hinge structure, the second hinge structure, and the third hinge structure and between the inside of the hinge housing and the first detent structure and the at least one second detent structure.

The foreign matter collection member disposed between the first hinge structure and the inside of the hinge housing may be formed to be larger than the foreign matter collection member disposed between the third hinge structure and the inside of the hinge housing.

The number of foreign matter collection members disposed between the first hinge structure and the inside of the hinge housing may be larger than the number of foreign matter collection members disposed between the third hinge structure and the inside of the hinge housing.

The at least one foreign matter collection member may be disposed under the display.

The at least one foreign matter collection member may include at least one of a tape, gel, and liquid form.

According to an embodiment, an electronic device may include a first housing, a second housing, a display disposed on the first housing and the second housing, at least one hinge structure that connects edges at which the first housing and the second housing meet when the display is in a flat state, a hinge housing 150 in which the hinge structure is mounted, and at least one foreign matter collection member disposed between the hinge structure and the hinge housing. A first axis (or a first virtual axis) about which the first housing rotates and a second axis (or a second virtual axis) about which the second housing rotates may be formed at positions spaced apart upward from a bottom surface of the display by a predetermined distance.

The at least one hinge structure may include a hinge structure disposed in the center of the hinge housing, and the hinge structure may include main brackets, a first inner bracket and a second inner bracket that are coupled with the main brackets and that perform rotary motions in different directions, at least one idle gear engaged with internal gears of the first inner bracket and the second inner bracket, and main gears engaged with the at least one idle gear. A specified gap may be formed between at least part of the first inner bracket and a rear surface of the display or between at least part of the second inner bracket and the rear surface of the display when the first housing and the second housing are in a flat state.

Figure 13:
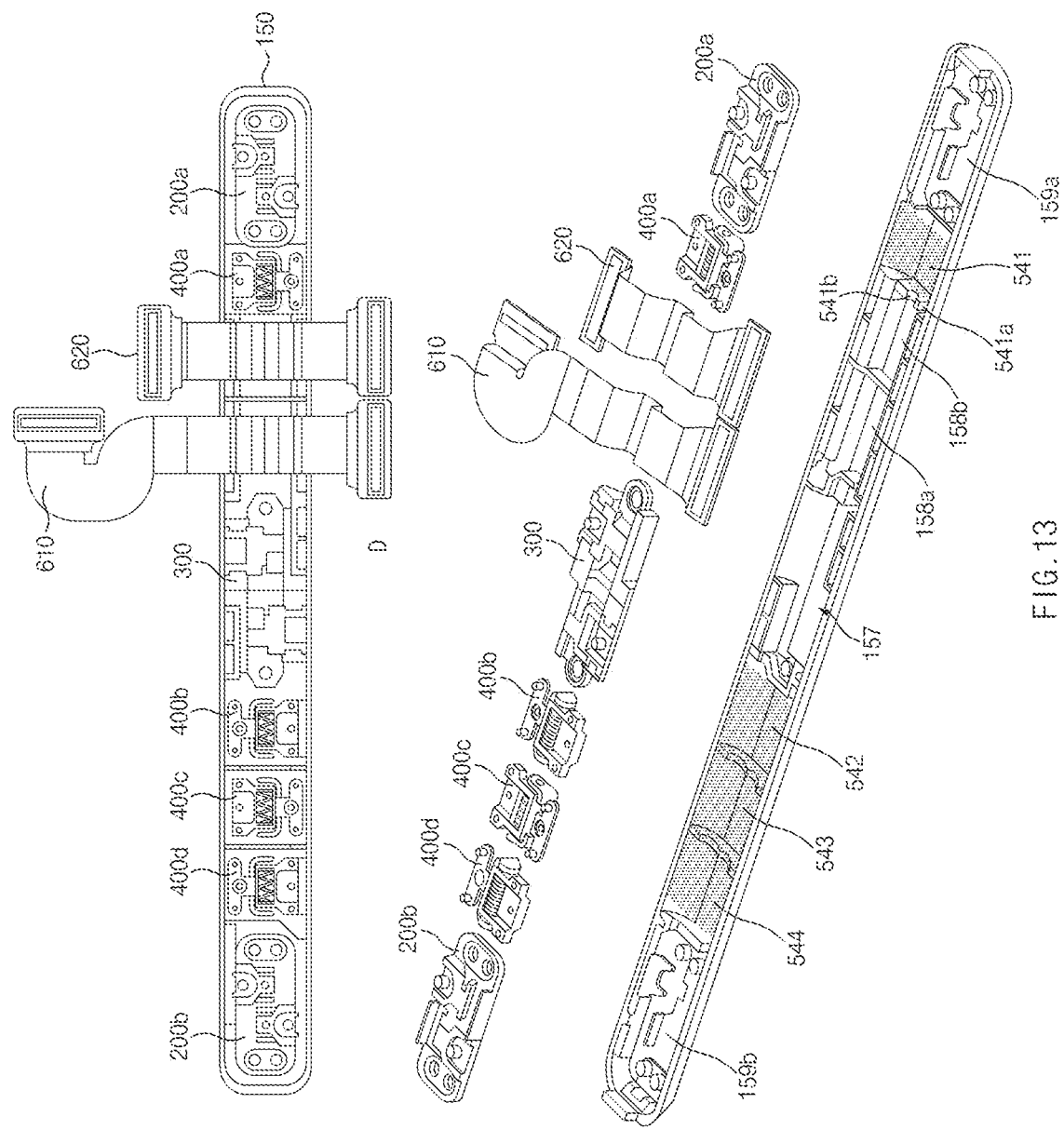
FIG. 13 illustrates an arrangement of foreign matter collection members according to a first embodiment.

FIG. 13 illustrates an arrangement of foreign matter collection members according to a first embodiment.

Referring to FIG. 13, as described above with reference to FIG. 4, the hinge housing 150 may have an overall cylindrical shape that has an empty space inside and that is closed at opposite ends. At least part of the inside or outside of the hinge housing 150 may include a curved area or a flat area. The hinge structures 200a, 200b, and 300 and the detent structures 400a, 400b, 400c, and 400d may be disposed in the hinge housing 150. Additionally or alternatively, at least one pieces of signal wiring 610 or 620 may be disposed on one side of the hinge housing 150. For example, the at least two pieces of signal wiring 610 and 620 may support signal transmission between a first electronic component (or electronic part) disposed in a first housing structure and a second electronic component (or electronic part) disposed in a second housing structure. The at least two pieces of signal wiring 610 and 620 may include the first signal wiring 610 (e.g., a first FPCB) and the second signal wiring 620 (e.g., a second FPCB). The first signal wiring 610 and the second signal wiring 620 may be implemented with one FPCB. At least a part of the first signal wiring 610 and at least part of the second signal wiring 620 may be implemented in a rigid type or a flexible type, and at least parts of the remaining wiring portions beyond opposite edges of the hinge housing 150 that are connected with the at least partial areas disposed in the hinge housing 150 may be implemented in a rigid type.

The foreign matter collection members 541, 542, 543, and 544 may be disposed on at least partial areas of the inside of the hinge housing 150 other than areas 159a, 159b, and 157 where structures (e.g., the first hinge structure 200a, the second hinge structure 200b, and the third hinge structure 300) that support a hinge function of the electronic device are disposed. For example, no foreign matter collection members may be disposed on the first inner surface 159a of the hinge housing 150 on which the first hinge structure 200a is mounted, the second inner surface 159b of the hinge housing 150 on which the second hinge structure 200b is disposed, and the third inner surface 157 of the hinge housing 150 on which the third hinge structure 300 is disposed. The foreign matter collection members 541, 542, 543, and 544 may be disposed on only the inner surfaces of the hinge housing 150 on which the first to fourth detent structures 400a, 400b, 400c, and 400d are disposed. As the electronic device having the above-described structure does not include separate foreign matter collection members under the hinge structures 200a, 200b, and 300 that perform hinge motions, the hinge motions of the hinge structures 200a, 200b, and 300 may not be hampered by collected foreign matter. Furthermore, as the hinge structures 200a, 200b, and 300 do not make direct contact with the foreign matter collection members having stickiness or adhesiveness, an impediment to the hinge motions of the hinge structures 200a, 200b, and 300 by the foreign matter collection members may be prevented.

In FIG. 13, no foreign matter collection members may be disposed on a first wiring arrangement area 158a (or an inner surface) and a second wiring arrangement area 158b (or an inner surface) of the hinge housing 150 where the first signal wiring 610 and the second signal wiring 620 are mounted. Accordingly, damage to the first signal wiring 610 and the second signal wiring 620 by the foreign matter collection members having stickiness or adhesiveness may be prevented, and the signal wiring 610 and 620 may be easy to replace. For example, when foreign matter collection members are applied to the first wiring arrangement area 158a and the second wiring arrangement area 158b and the signal wiring 610 and the signal wiring 620 are mounted on the corresponding areas, the signal wiring 610 and the signal wiring 620 may be fixed by being stuck or attached to the foreign matter collection members. Therefore, while the electronic device performs hinge motion, the signal wiring 610 and 620 may be damaged, or may be at least partially worn by contact with surrounding structures. Furthermore, because the signal wiring 610 and the signal wiring 620 are attached to the bottom surface of the hinge housing 150 through the foreign matter collection members, at least parts of the signal wiring 610 and the signal wiring 620 may be damaged in a replacement or rearrangement process. Accordingly, no separate foreign matter collection members may be disposed on the signal wiring areas 158*a* and 158*b*.

A foreign matter collection member may be applied to at least a partial area of at least one of an upper surface of the first signal wiring 610 facing an opposite direction to the direction in which the first signal wiring 610 is mounted on the hinge housing 150, or a surface facing toward the rear surface of the display 110, and an upper surface of the second signal wiring 620. As the display 110 is disposed over the signal wiring 610 and 620, the signal wiring 610 and 620 and the display 110 may interfere with each other during hinge motion. Therefore, the foreign matter collection members may be disposed on partial areas of the signal wiring 610 and 620, and the partial areas may be areas disposed on the inside of the hinge housing 150 and not brought into contact with the display 110 during hinge motion.

A partition wall 541*a* may be disposed between the second signal wiring area 158*b* and one area of the hinge housing 150 on which the first detent structure 400*a* is mounted. An opening 541*b* (or, a passage, hole, or recess) may be formed on one side of the partition wall 541*a* to connect a space including the second signal wiring area 158*b* and a space including the one area of the hinge housing 150 on which the first detent structure 400*a* is mounted. Accordingly, foreign matter introduced into the space including the second signal wiring area 158*b* may be moved through the opening 541*b* to the one area of the hinge housing 150 where the first foreign matter collection member 541 is disposed (or applied) and the first detent structure 400*a* is mounted.

The hinge housing 150 may further include a partition wall that separates the first signal wiring area 158*a* and at least part of the second signal wiring area 158*b* (or, a partition wall disposed in at least part of a space between the first signal wiring area 158*a* and the second signal wiring area 158*b* or a partition wall that divides the first signal wiring area 158*a* and at least part of the second signal wiring area 158*b*). An opening identical to the opening 541*b* may be formed in the partition wall between the first signal wiring area 158*a* and the second signal wiring area 158*b*. Foreign matter introduced into the first signal wiring area 158*a* may be moved to the second signal wiring area 158*b* through the opening formed in the partition wall, and the foreign matter introduced into the second signal wiring area 158*b* may be moved to the first foreign matter collection member 541 through the opening 541*b* mentioned above and may be collected by the first foreign matter collection member 541.

Figure 14B:
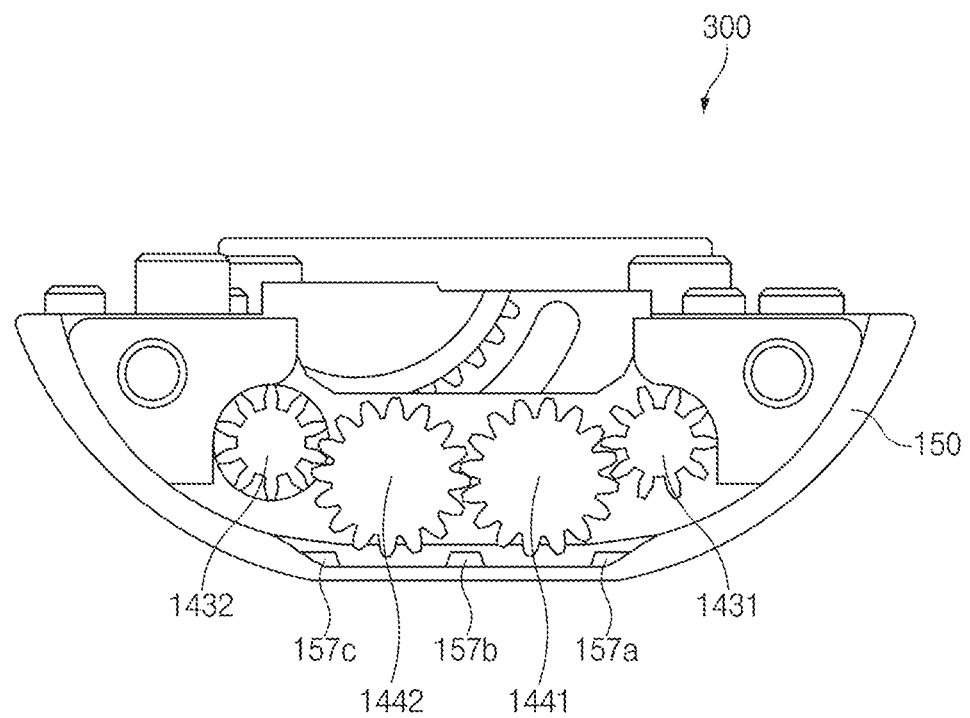
FIG. 14B is a sectional view taken along line D-D' of FIG. 14A.

FIG. 14A illustrates another example of an arrangement of foreign matter collection members according to a second embodiment. FIG. 14B is a sectional view taken along line D-D' of FIG. 14A.

Referring to FIGS. 14A and 14B, at least one of the foreign matter collection members 541, 542, 543, and 544 may be disposed on at least a partial area of the inside of the hinge housing 150 on which the first to fourth detent structures 400*a*, 400*b*, 400*c*, and 400*d* are mounted. At least one foreign matter collection patterns 157*a*, 157*b*, or 157*c* may be disposed on at least partial areas of the third inner surface 157 of the hinge housing 150 on which the third hinge structure 300 is mounted. The foreign matter collection patterns 157*a*, 157*b*, and 157*c* may be partly disposed on the third inner surface 157 and may be disposed on areas that do not affect hinge motion of the third hinge structure 300. As illustrated in FIG. 14B, the third hinge structure 300 may include at least one gear. The foreign matter collection patterns 157*a*, 157*b*, and 157*c* may be disposed on areas other than the area where the gear and the third inner surface 157 face each other within a predetermined distance. For example, the third hinge structure 300 may include the first main gear 1431, the second main gear 1432, the first idle gear 1441, and the second idle gear 1442. The first foreign matter collection pattern 157*a* may be disposed on an area of the inside of the hinge housing 150 that corresponds to the area between the first main gear 1431 and the first idle gear 1441. The second foreign matter collection pattern 157*b* may be disposed on an area of the inside of the hinge housing 150 that corresponds to the area between the first idle gear 1441 and the second idle gear 1442. The third foreign matter collection pattern 157*c* may be disposed on an area of the inside of the hinge housing 150 that corresponds to the area between the second idle gear 1442 and the second main gear 1432. As illustrated, the foreign matter collection patterns 157*a*, 157*b*, and 157*c* have a predetermined length (e.g., the horizontal length of the third hinge structure 300 with respect to FIG. 14A) in the horizontal axis direction of the hinge housing 150 and are arranged in a stripe form. However, the disclosure is not limited thereto. For example, the foreign matter collection patterns 157*a*, 157*b*, and 157*c* may be formed in a dot type, or at least a part thereof may be formed to be a curved line (or a curved surface).

In FIGS. 13, 14A and 14B, foreign matter collection patterns may be partly disposed on at least partial areas of the first inner surface 159*a* and the second inner surface 159*b* on which the first hinge structure 200*a* and the second hinge structure 200*b* are mounted. For example, foreign matter collection patterns 200F and 200G may be disposed on the remaining areas of the first inner surface 159*a* and the second inner surface 159*b* other than the areas where the hinge brackets of the hinge structures 200*a* and 200*b* are opposite the hinge housing 150. The foreign matter collection patterns 200F and 200G may include at least one dot or at least one vertical stripe (e.g., a stripe facing a direction perpendicular to the lengthwise direction of the hinge housing 150 with respect to FIG. 14A). A plurality of foreign matter collection patterns may be disposed on the first inner surface 159*a*. For example, on the first inner surface 159*a*, foreign matter collection patterns may be disposed on one area of the hinge housing 150 that corresponds to a right edge of the first hinge structure 200*a* and another area of the hinge housing 150 that corresponds to a left edge of the first hinge structure 200*a* Similar to the first inner surface 159*a*, the second inner surface 159*b* may have a plurality of foreign matter collection patterns disposed thereon. Alternatively, foreign matter collection patterns may be disposed on only the right edge of the first inner surface 159*a* and the left edge of the second inner surface 159*b*.

The hinge housing 150 may include a partition wall 156*a* that separates the second inner surface 159*b* on which the second hinge structure 200*b* is disposed and at least part of the area on which the fourth detent structure 400*d* is disposed (or, a partition wall 156*a* disposed in at least part of a space between the second inner surface 159*b* on which the second hinge structure 200*b* is disposed and the area on which the fourth detent structure 400*d* is disposed or a partition wall 156*a* that divides the second inner surface 159*b* on which the second hinge structure 200*b* is disposed and at least part of the area on which the fourth detent structure 400*d* is disposed). The partition wall 156*a* may include an opening 156*b* (or, a passage, hole, or recess) that connects a space including the second inner surface 159*b* and a space including the area on which the fourth detent structure 400*d* is disposed. Foreign matter introduced into the space including the second inner surface 159*b* may be moved to the fourth foreign matter collection member 544 through the opening 156*b*. Accordingly, the opening 156*b* may be used to collect, through the fourth foreign matter collection member 544, foreign matter introduced into the area of the hinge housing 150 around the fourth foreign matter collection member 544. Similarly, the hinge housing 150 may include a partition wall that separates the first inner surface 159*a* and at least part of the area where the first detent structure 400*a* is disposed, and the partition wall may include at least one recess or hole that enables a movement of foreign matter between a space including the first inner surface 159*a* and a space including the area where the first detent structure 400*a* is disposed. The hinge housing 150 may further include a partition wall that separates a space including the third inner surface 157 and at least part of a space including the first signal wiring area 158*a*, and the partition wall may include an opening that enables a movement of foreign matter introduced into the space including the first signal wiring area 158*a* to the third inner surface 157.

As described above, the electronic device may not include, or may minimally include, separate foreign matter collection members on the areas of the hinge housing 150 on which the hinge structures 200*a*, 200*b*, and 300 that perform hinge motions are disposed, thereby minimizing components that hamper the hinge motions. In addition, the electronic device may include foreign matter collection members on the other areas to support collecting foreign matter. Accordingly, the electronic device may minimize a movement of foreign matter and may suppress damage to parts by the foreign matter.

According to an embodiment, an electronic device may include a first housing, a second housing, a display disposed on the first housing and the second housing, at least one hinge structure that connects the first housing and the second housing, a hinge housing that surrounds at least part of the hinge structure, and at least one foreign matter collection member that is disposed on one side of the hinge structure and that collects foreign matter introduced into the electronic device. The at least one hinge structure may include at least one bracket or at least one gear used to rotate the first housing and the second housing, and the electronic device may further include, on a surrounding area of the inside of the hinge housing that is opposite the at least one bracket or the at least one gear, at least one foreign matter collection pattern 157*a*, 157*b*, or 157*c* used to collect the foreign matter.

The at least one hinge structure may include a first hinge structure disposed at a left edge of the hinge housing, a second hinge structure disposed at a right edge of the hinge housing, a third hinge structure disposed in the center of the hinge housing, and at least one detent structure disposed between the first hinge structure and the third hinge structure or between the second hinge structure and the third hinge structure. The at least one foreign matter collection member may be disposed on the inside of the hinge housing on which the at least one detent structure is mounted.

According to an embodiment, an electronic device may include a first housing, a second housing, a display disposed on the first housing and the second housing, at least one hinge structure, that connects edges at which the first housing and the second housing meet when the display is in a flat state, at least one detent structure connected to the first housing and the second housing, a hinge housing in which at least part of the at least one hinge structure and at least part of the at least one detent structure are mounted, and at least one foreign matter collection member disposed on at least part of the inside of the hinge housing on which the at least one detent structure is mounted. A first axis about which the first housing rotates and a second axis about which the second housing rotates may be formed at positions spaced apart upward from a bottom surface of the display by a predetermined distance.

The hinge housing may include at least one partition wall disposed between a first area where at least part of the at least one hinge structure is disposed and a second area where at least part of the at least one detent structure is disposed. The at least one partition wall may include at least one opening that is used to move foreign matter introduced into the first area, in which the at least one hinge structure is disposed, to the second area in which the at least one detent structure is disposed.

The electronic device may further include at least one piece of signal wiring, at least part of which is disposed inside the hinge housing, the at least one piece of signal wiring connecting a first electronic component disposed in the first housing and a second electronic component disposed in the second housing, and a partition wall that separates an area of the hinge housing where the at least one piece of signal wiring is disposed and at least part of a surrounding area (or a partition wall disposed between the area of the hinge housing and the surrounding area). The partition wall may include at least one passage used to move foreign matter introduced into the area of the hinge housing, in which the signal wiring is disposed, to the surrounding area.

At least one foreign matter collection pattern may be partly or locally disposed on at least a partial area of the hinge housing.

In the above description, at least one of the first and second electronic components may be at least one processor, at least one camera, at least one display, at least one sensor, or at least one memory. The first electronic component and the second electronic component may be implemented with the same component (e.g., both the first electronic component and the second electronic component being processors), or different components (e.g., the first electronic component being a processor and the second electronic component being a display or a memory).

Each module or program module may be composed of single entity or a plurality of entities, a part of the above-described sub-components may be omitted, or other sub-components may be further included. Alternatively or additionally, after being integrated in one entity, some components (e.g., a module or a program module) may identically or similarly perform the function executed by each corresponding component before integration. According to various embodiments, operations executed by modules, program modules, or other components may be executed by a successive method, a parallel method, a repeated method, or a heuristic method, or at least one part of operations may be executed in different sequences or omitted. Other operations may be added.

The electronic device including the hinge structure minimizes introduction of foreign matter into the electronic device, suppresses a movement of introduced foreign matter in the electronic device, and thus, minimizes an influence of foreign matter on components in the electronic device.

The disclosure may provide an electronic device having a structure for preventing contact of foreign matter with a rear surface of a display of the electronic device.

Other aspects and effects provided by the hinge structure herein may be realized.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
    a first housing;
    a second housing;
    a display disposed on the first housing and the second housing;
    at least one hinge structure configured to connect the first housing and the second housing;
    a hinge housing configured to accommodate at least part of the at least one hinge structure; and
    at least one foreign matter collection member disposed on one side of the at least one hinge structure and configured to collect foreign matter introduced into the electronic device,
    wherein the at least one hinge structure includes a first hinge structure disposed at a left edge of the hinge housing, and a second hinge structure disposed at a right edge of the hinge housing,
    wherein at least one of the first hinge structure and the second hinge structure includes a center bracket, a first hinge bracket connected to the center bracket and configured to rotate in a first direction, and a second hinge bracket connected to the center bracket and configured to rotate in a second direction, and
    wherein a specified gap is formed between at least part of the first hinge bracket and a rear surface of the display or between at least part of the second hinge bracket and the rear surface of the display when the first housing and the second housing are in a flat state.

2. The electronic device of claim 1, wherein the at least one foreign matter collection member is disposed on at least one of an upper side of the first hinge structure and an upper side of the second hinge structure.

3. The electronic device of claim 2, wherein the at least one foreign matter collection member is disposed on at least one of a left edge and a right edge of the first hinge structure and at least one of a left edge and a right edge of the second hinge structure.

4. The electronic device of claim 2, wherein the at least one foreign matter collection member is disposed on at least one of at least one boss hole area provided on one side of the first hinge structure and used to couple the first hinge structure and the hinge housing and at least one boss hole area provided on one side of the second hinge structure and used to couple the second hinge structure and the hinge housing.

5. The electronic device of claim 1,
    wherein the at least one foreign matter collection member is disposed in at least one of a space between the first hinge structure and the inside of the hinge housing and a space between the second hinge structure and the inside of the hinge housing.

6. The electronic device of claim 5, wherein at least one of the first hinge structure and the second hinge structure includes at least one foreign matter outlet formed through front and rear surfaces and configured to induce the foreign matter toward the inside of the hinge housing.

7. The electronic device of claim 1, wherein the at least one foreign matter collection member is disposed beneath the display.

8. The electronic device of claim 1, wherein the at least one foreign matter collection member includes at least one of a tape form, a gel form, and a liquid form.

* * * * *